US010910056B2

(12) United States Patent
Yabuuchi

(10) Patent No.: US 10,910,056 B2
(45) Date of Patent: Feb. 2, 2021

(54) SEMICONDUCTOR DEVICE

(71) Applicant: RENESAS ELECTRONICS CORPORATION, Tokyo (JP)

(72) Inventor: Makoto Yabuuchi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/250,448

(22) Filed: Jan. 17, 2019

(65) Prior Publication Data
US 2019/0259454 A1    Aug. 22, 2019

(30) Foreign Application Priority Data

Feb. 22, 2018  (JP) ................................ 2018-029824
Jun. 11, 2018  (JP) ................................ 2018-111265

(51) Int. Cl.
*G11C 15/04*    (2006.01)
(52) U.S. Cl.
CPC .................... *G11C 15/04* (2013.01)
(58) Field of Classification Search
CPC .................................................. G11C 15/046
USPC ......................................................... 365/49.1
See application file for complete search history.

(56) References Cited

U.S. PATENT DOCUMENTS

| 6,704,216 | B1* | 3/2004 | Cheng .................... | G11C 15/00 365/189.07 |
| 7,203,082 | B1* | 4/2007 | Bhatia ................. | G06F 12/0895 365/189.07 |
| 8,169,807 | B2* | 5/2012 | Dosaka .................... | G11C 15/04 365/49.17 |
| 9,824,757 | B2 | 11/2017 | Watanabe et al. | |
| 2001/0026464 | A1* | 10/2001 | Hata ....................... | G11C 15/00 365/49.1 |
| 2003/0161209 | A1* | 8/2003 | Gillingham ............ | G11C 15/04 365/227 |
| 2007/0247885 | A1* | 10/2007 | Watanabe ............ | G11C 15/043 365/49.17 |
| 2015/0348628 | A1* | 12/2015 | Matsuoka ............... | G11C 15/04 365/49.17 |

FOREIGN PATENT DOCUMENTS

JP    2013-222493 A    10/2013
JP    2017-045495 A    3/2017

* cited by examiner

*Primary Examiner* — Muna A Techane
(74) *Attorney, Agent, or Firm* — McDermott Will & Emery LLP

(57) ABSTRACT

A semiconductor device includes a plural search memory cells, a plural match lines, a plural sub-ground lines, and a plural amplifiers. The search memory cells are disposed in a matrix form. The match lines are disposed in association with respective memory cell rows and used to determine whether search data matches data stored in the search memory cells. The sub-ground lines are disposed in association with respective memory cell rows. The amplifiers are disposed in association with respective memory cell rows to amplify the potentials of the match lines. The match lines and the sub-ground lines are respectively precharged to a first potential and a second potential before a data search. When the search data is mismatched, the match lines are electrically coupled to associated sub-ground lines through the search memory cells and set to an intermediate potential that is intermediate between the first potential and the second potential.

5 Claims, 17 Drawing Sheets

| SRAM CELL (X CELL) | SRAM CELL (Y CELL) | TCAM CELL DATA |
|---|---|---|
| "1" | "0" | "0" |
| "0" | "1" | "1" |
| "0" | "0" | "*" (don't care) |
| "1" | "1" | NOT USED |

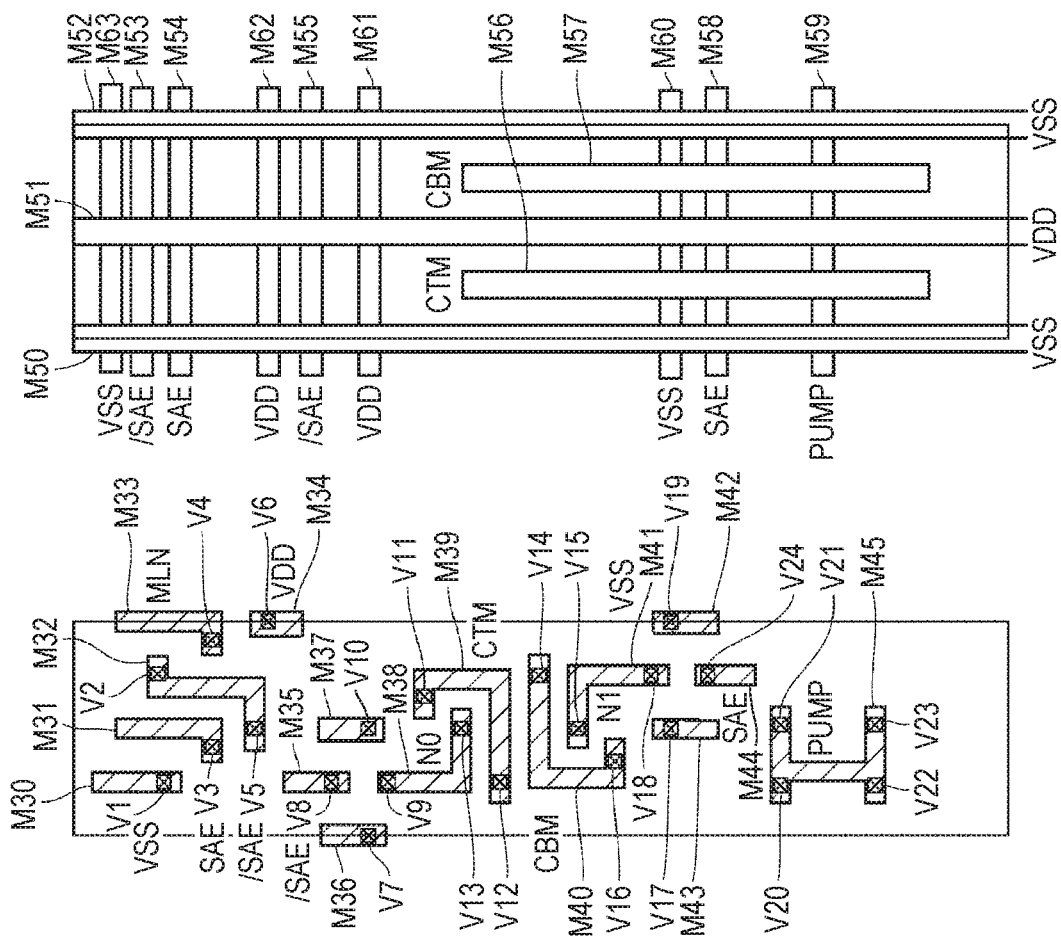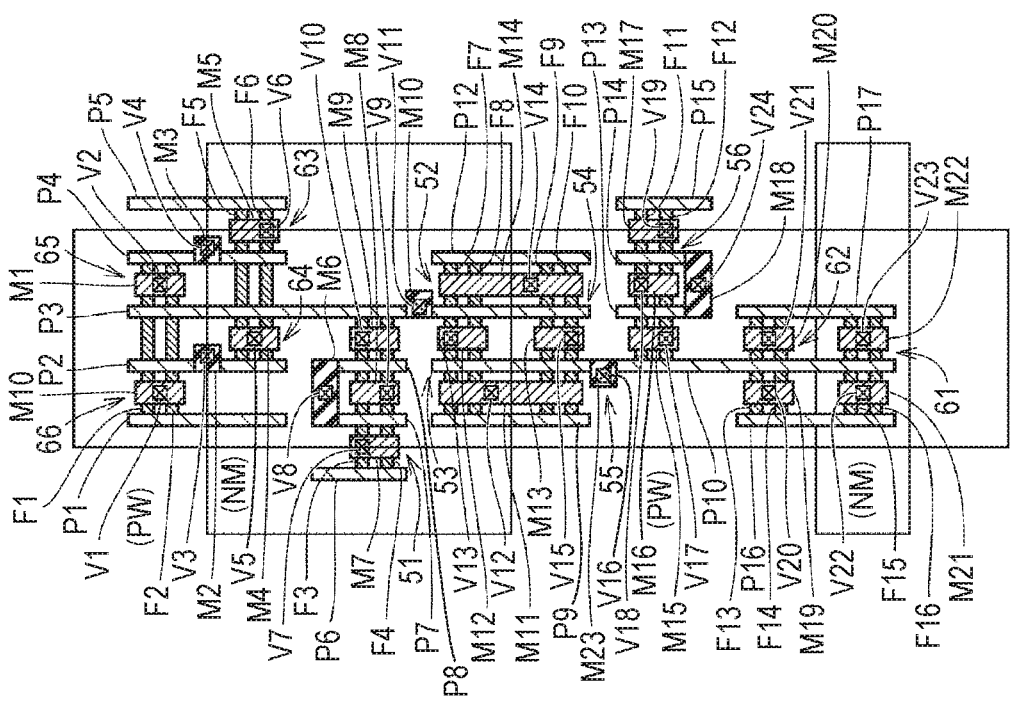

SEMICONDUCTOR DEVICE

CROSS-REFERENCE TO RELATED APPLICATIONS

The disclosures of Japanese Patent Application No. 2018-111265 filed on Jun. 11, 2018 and No. 2018-029824 filed on Feb. 22, 2018 including the specification, drawings and abstract is incorporated herein by reference in its entirety.

BACKGROUND

The present disclosure relates to a semiconductor device having memory cells.

A memory device called a search memory or a CAM (content addressable memory) searches stored data words for a data word that matches a search word. When a matching data word is found, such a memory device outputs its address.

The CAM comes in two types, namely a BCAM (binary CAM) and a TCAM (ternary CAM). Each memory cell of the BCAM stores "0" or "1" as information. Meanwhile, each memory cell of the TCAM is capable of storing "Don't Care" as information in addition to "0" and "1". In the present example, the symbol "*" is used to represent "Don't Care". The symbol "*" indicates that the information may be either "0" or "1".

TCAM devices are widely used in routers for networks, such as the Internet, in order to perform an address search and provide access control. To provide a large capacity, the TCAM devices usually include multiple arrays and perform a simultaneous search operation on each of the included arrays.

The TCAM devices are capable of comparing search data (input packets) and TCAM cell data all at once. Therefore, the TCAM devices are faster in all search applications than RAMs (random-access memories) (Japanese Unexamined Patent Application Publications No. 2013-222493 and 2017-45495).

More specifically, the TCAM devices include match lines (MLs) for comparing data stored in a memory cell with data that a user wants to search for, and indicating whether or not the data match each other. The TCAM devices output address information (hit index) associated with a matched match line.

Meanwhile, search operations consume a large amount of electrical power because mismatched match lines are set to a low potential.

SUMMARY

In the above respect, methods described in Japanese Unexamined Patent Application Publications No. 2013-222493 and 2017-45495 make it necessary to perform a charging operation before a search operation in order to increase the electrical potential of match lines, but consume a large amount of electrical power during charging and discharging operations.

The present disclosure has been made in view of the above circumstances and provides a semiconductor device capable of reducing power consumption.

Other problems and novel features will become apparent from the following description and from the accompanying drawings.

According to an aspect of the present disclosure, there is provided a semiconductor device including multiple search memory cells, multiple match lines, multiple sub-ground lines, and multiple amplifiers. The search memory cells are disposed in a matrix form. The match lines are disposed in association with respective memory cell rows and used to determine whether or not search data matches data stored in the search memory cells. The sub-ground lines are disposed in association with respective memory cell rows. The amplifiers are disposed in association with respective memory cell rows to amplify the potentials of the match lines. The match lines and the sub-ground lines are respectively precharged to a first potential and a second potential before a data search. When the search data is mismatched, the match lines are electrically coupled to associated sub-ground lines through the search memory cells and set to an intermediate potential that is intermediate between the first potential and the second potential.

A semiconductor device according to an embodiment of the present disclosure is able to reduce power consumption because it performs a precharge before a data search from the intermediate potential that is intermediate between the first potential and the second potential.

BRIEF DESCRIPTION OF THE DRAWINGS

FIGS. 10A to 10C are diagrams illustrating a layout configuration of a MOS transistor according to the first modification of the second embodiment;

DETAILED DESCRIPTION

Figure 1:
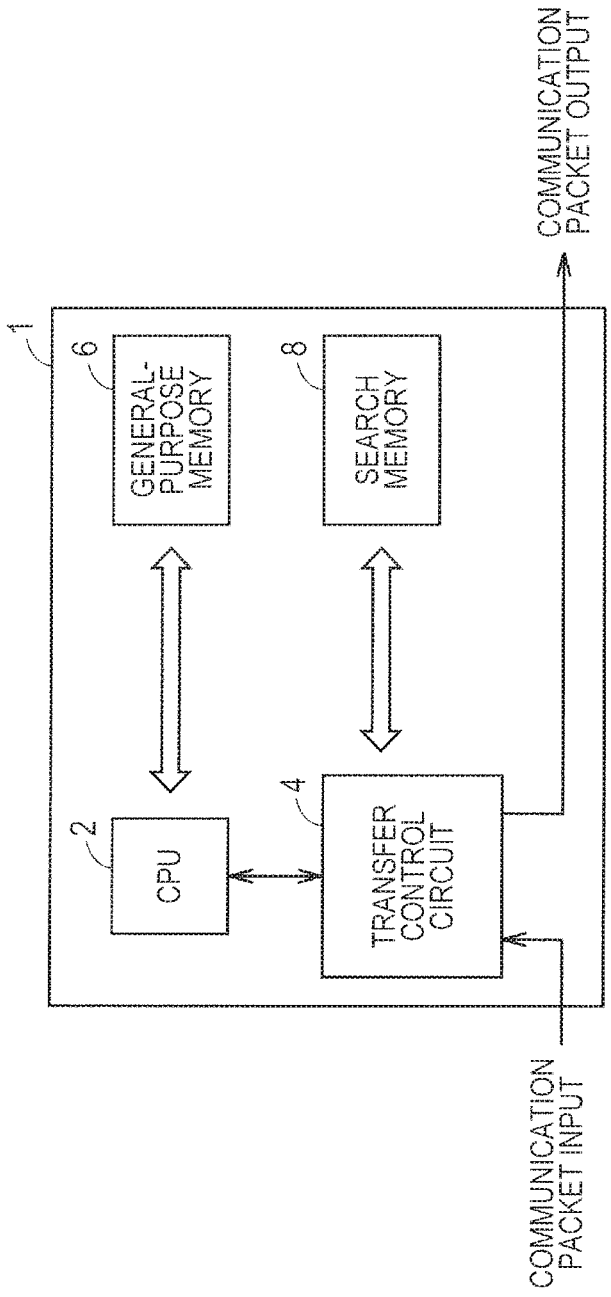
FIG. 1 is a diagram illustrating a configuration of communication equipment according to a first embodiment.

Embodiments of the present disclosure will now be described in detail with reference to the accompanying drawings. Identical or similar elements in the drawings are designated by the same reference numerals and will not be redundantly described.

First Embodiment

<Overall Configuration of Communication Equipment 1>

FIG. 1 is a diagram illustrating a configuration of communication equipment 1 according to a first embodiment.

As illustrated in FIG. 1, the communication equipment 1 is a communication device such as a switch or a router.

The communication equipment 1 includes a CPU (central processing unit) 2, a transfer control circuit 4, a general-purpose memory 6, and a search memory 8.

The CPU 2 provides overall control of the communication equipment 1.

The CPU 2 implements various functions in collaboration with a program stored in the general-purpose memory 6. For example, the general-purpose memory 6 may be formed of a DRAM (dynamic random access memory), and builds an operating system (OS) in collaboration with the CPU 2. The CPU 2 exchanges information, for example, with neighboring communication equipment and exercises maintenance of information necessary for transfer processing.

The transfer control circuit 4 executes a communication packet transfer process. The transfer control circuit 4 includes dedicated hardware specialized for transfer processing, such as an ASIC (application specific integrated circuit) or an NPU (network processing unit). The transfer control circuit 4 accesses the search memory 8 to acquire information necessary for transfer processing.

In the present example, the search memory 8 will be described in relation to a case where a TCAM device is used.

[Configuration of TCAM Cell]

Figures 2, 3:
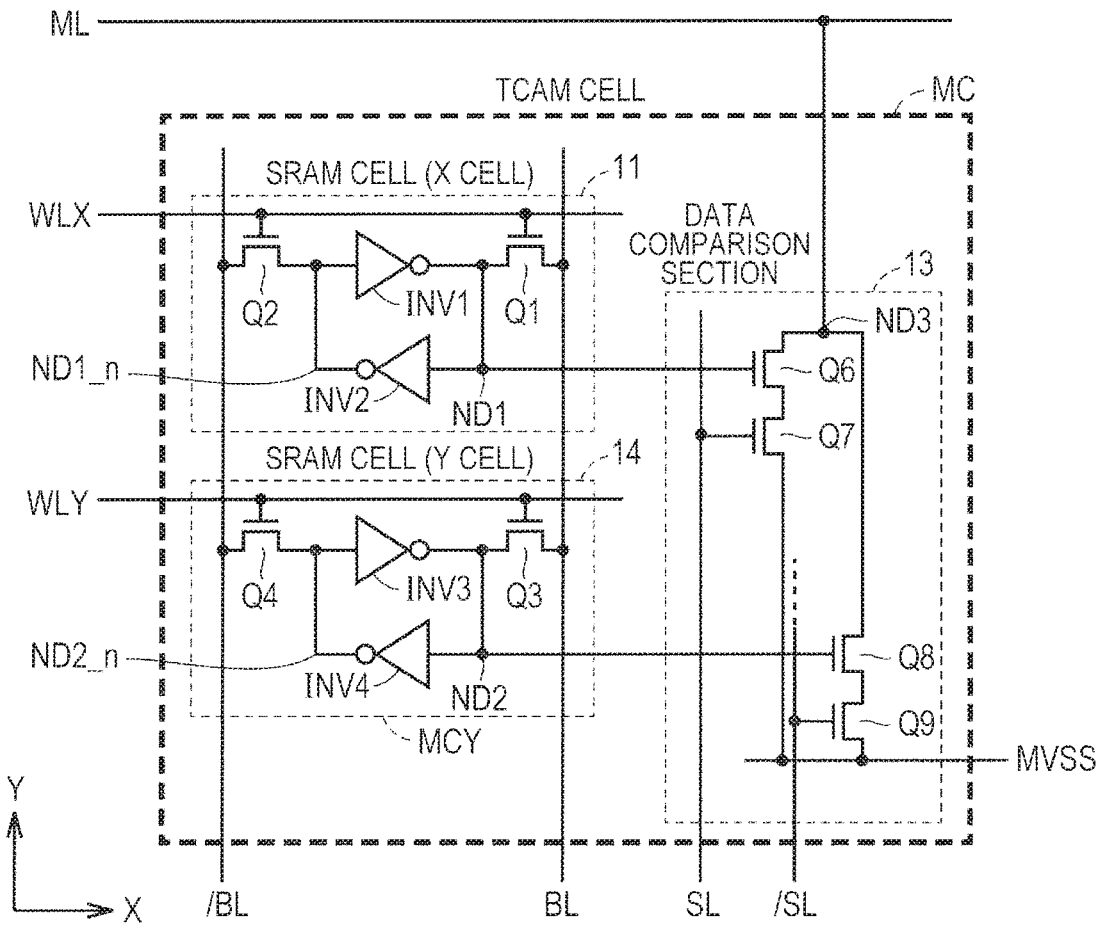
FIG. 2 is a circuit diagram illustrating an exemplary configuration of a TCAM cell.
FIG. 3 is a diagram illustrating, in tabular form, the association between TCAM data and contents stored in an X cell and a Y cell, which are depicted in FIG. 2.

FIG. 2 is a circuit diagram illustrating an exemplary configuration of a TCAM cell.

Referring to FIG. 2, the TCAM cell (referred to also as the memory cell MC) includes two SRAM cells (static random access memory cells) 11, 14 and a data comparison section 13. The SRAM cell 11 is referred to also as the X cell, and the SRAM cell 14 is referred to also as the Y cell. The X cell 11 stores 1-bit data that is mutually complementary to a pair of internal storage nodes ND1, ND1_n (if one is "1", the other is "0"). The Y cell 14 stores 1-bit data that is mutually complementary to a pair of internal storage nodes ND2, ND2_n. The TCAM cell is referred to also as the search memory cell.

The TCAM cell is coupled to a pair of bit lines BL, /BL, a pair of search lines SL, /SL, a match line ML, and word lines WLX, WLY. The pair of bit lines BL, /BL is extended in the column direction (Y direction) of a TCAM cell array 20 depicted in FIG. 6 and shared by multiple TCAM cells disposed in the column direction. The pair of search lines SL, /SL is extended in the column direction (Y direction) of the TCAM cell array 20 and shard by the TCAM cells disposed in the column direction.

The match line ML is extended in the row direction (X direction) of the TCAM cell array 20 and shared by the TCAM cells disposed in the row direction. The word lines WLX, WLY are extended in the row direction (X direction) of the TCAM cell array 20 and shared by the TCAM cells disposed in the row direction.

The X cell 11 includes inverters INV1, INV2 and N-channel MOS (metal oxide semiconductor) transistors Q1, Q2. The inverter INV1 is coupled between the storage node ND1 and the storage node ND1_n so that the direction from the storage node ND1_n to the storage node ND1 is a forward direction. The inverter INV2 is coupled in parallel with the inverter INV1 and oriented in an opposite direction to the inverter INV1. The MOS transistor Q1 is coupled between the storage node ND1 and the bit line BL. The MOS transistor Q2 is coupled between the storage node ND1_n and the bit line /BL. The gates of the MOS transistors Q1, Q2 are coupled to the word line WLX.

The Y cell 14 includes inverters INV3, INV4 and MOS (metal oxide semiconductor) transistors Q3, Q4. The inverter INV3 is coupled between the storage node ND2 and the storage node ND2_n so that the direction from the storage node ND2_n to the storage node ND2 is a forward direction. The inverter INV4 is coupled in parallel with the inverter INV3 and oriented in an opposite direction to the inverter INV3. The MOS transistor Q3 is coupled between the storage node ND2 and the bit line BL. The MOS transistor Q4 is coupled between the storage node ND2_n and the bit line /BL. The gates of the MOS transistors Q3, Q4 are coupled to the word line WLY.

The data comparison section 13 includes N-channel MOS transistors Q6-Q9. The MOS transistors Q6, Q7 are series-coupled between a node ND3 and a sub-ground line MVSS. The node ND3 is a point of coupling to the match line ML. The sub-ground line MVSS is set to a ground potential. The MOS transistors Q8, Q9 are series-coupled between the node ND3 and the sub-ground line MVSS, which is set to the ground potential, and parallel-coupled to a set of the series-coupled MOS transistors Q6, Q7. The gates of the MOS transistors Q6, Q8 are respectively coupled to the storage nodes ND1, ND2. The gates of the MOS transistors Q7, Q9 are respectively coupled to the search lines SL, /SL.

FIG. 3 is a diagram illustrating, in tabular form, the association between TCAM data and contents stored in the X cell and Y cell depicted in FIG. 2.

Referring to FIGS. 2 and 3, a TCAM cell is capable of storing three values, namely "0", "1", and "*" (don't care), by using the 2-bit SRAM cells. More specifically, when "1" is stored in the storage node ND1 of the X cell 11 and "0" is stored in the storage node ND2 of the Y cell 14, it is assumed that "0" is stored in the TCAM cell. When "0" is stored in the storage node ND1 of the X cell 11 and "1" is stored in the storage node ND2 of the Y cell 14, it is assumed that "1" is stored in the TCAM cell. When "0" is stored in the storage node ND1 of the X cell 11 and "0" is stored in the storage node ND2 of the Y cell 14, it is assumed that "*" (don't care) is stored in the TCAM cell. When "1" is stored in the storage node ND1 of the X cell 11 and "1" is stored in the storage node ND2 of the Y cell 14, data in the TCAM cell is not used.

A configuration of the above TCAM cell will now be described.

When search data is "1" (that is, the search line SL is "1" and the search line /SL is "0") and the TCAM data is "0" (the storage node ND1 is "1" and the storage node ND2 is "0"), the MOS transistors Q6, Q7 are on. Thus, the potential of a precharged match line ML coupled to the sub-ground line MVSS is decreased to a ground potential. When the search data is "0" (that is, the search line SL is "0" and the search line /SL is "1") and the TCAM data is "1" (the storage node ND1 is "0" and the storage node ND2 is "1"), the MOS transistors Q8, Q9 are on. Thus, the potential of the precharged match line ML coupled to sub-ground line MVSS is decreased to the ground potential. That is to say, when the search data does not match the TCAM data, the potential of the match line ML is decreased to the ground potential.

Conversely, when inputted search data is "1" and the TCAM data is "1" or "*", or when the search data is "0" and the TCAM data is "0" or "*" (that is, when the search data and the TCAM data match each other), the potential of the precharged match line ML (power supply voltage VDD level) is maintained.

As described above, a TCAM is such that the potential stored in the match line ML is pulled down unless data in all TCAM cells coupled to a match line ML associated with one entry (row) matches the search data. Therefore, the TCAM performs a high-speed search, but consumes a large amount of current.

Figure 4:
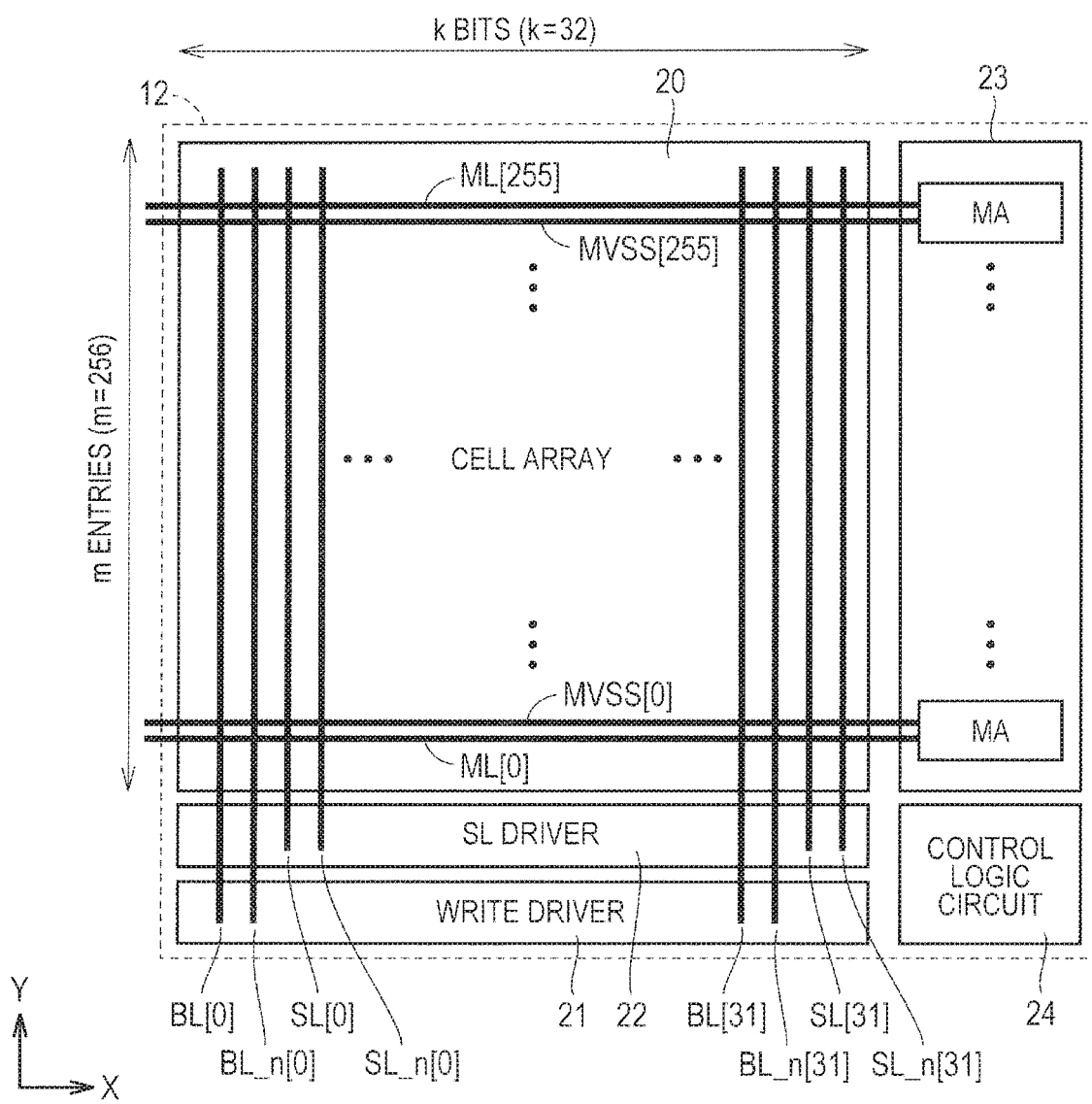
FIG. 4 is a diagram illustrating a configuration of a segment (subblock) included in a search memory according to the first embodiment.

FIG. 4 is a diagram illustrating a configuration of a segment (subblock) 12 included in the search memory 8 according to the first embodiment.

As illustrated in FIG. 4, the segment 12 includes the TCAM cell array 20 (simply referred to also as the cell array), a write driver group 21, a search line driver group 22, a match amplifier section 23, and a control logic circuit 24.

Although not depicted, the segment 12 includes a word line driver (not depicted) and an input/output circuit (not depicted). The word line driver drives the word lines WLX, WLY. The input/output circuit receives, for example, the inputs of control signals and address signals.

The TCAM cell array 20 includes TCAM cells that are disposed in a matrix form (m rows and k columns). In the present example, the depicted cell array 20 is such that the number of rows (the number of entries) m is 256, and that the number of columns (the number of bits) k is 40. It should be noted that the cell array 20 includes at least one redundant memory cell column.

In association with the columns of the cell array 20, k (k=32) bit line pairs (BL0 and /BL0 to BL(k-1) and /BL(k-1)) and k (k=32) search line pairs (SL0 and /SL0 to SL(k-1) and /SL(k-1)) are disposed.

In association with the rows of the cell array 20, m (m=256) match lines (ML0 to ML(N-1)), m X-cell word lines (WLX0 to WLX(N-1)) (not depicted), and m Y-cell word lines (WLY0 to WLY(N-1)) (not depicted) are disposed. Further, in the present example, sub-ground lines MVSS disposed in parallel with the match lines and coupled to the ground potential are disposed. The sub-ground lines MVSS0-MVSS255 are disposed.

During a write operation, the write driver group 21 supplies write data to each TCAM cell through the pair of bit lines BL, /BL. During a search operation, the search line driver group 22 supplies search data to each TCAM cell through the pair of search lines SL, /SL.

The control logic circuit 24 controls the overall operation of the segment 12. During a search operation, for example, the control logic circuit 24 receives a search command and outputs a control signal to the search line driver group 22 and the match amplifier section 23 in order to control the operations of the search line driver group 22, the match amplifier section 23, and a precharge circuit.

The match amplifier section 23 includes multiple match amplifiers MA that are associated with the rows of the cell array. During a search operation, the match amplifiers MA detect, in accordance with the potential of an associated match line ML, whether the associated portion of the search data matches the associated TCAM cell data. In the present embodiment, the match amplifier section 23 includes a precharge circuit that precharges the associated match line ML before a search operation.

Figure 5:
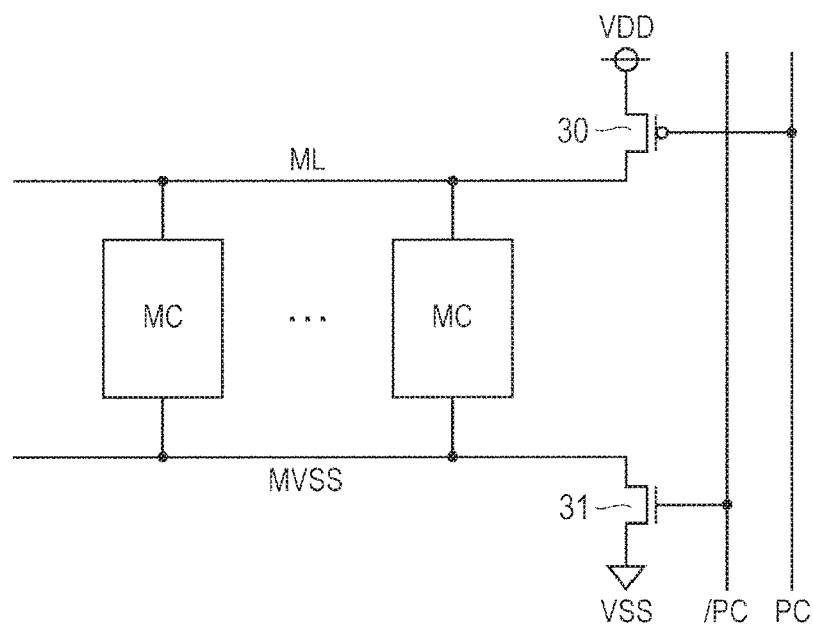
FIG. 5 is a diagram illustrating a configuration of a precharge circuit according to the first embodiment.

FIG. 5 is a diagram illustrating a configuration of the precharge circuit according to the first embodiment.

As illustrated in FIG. 5, the precharge circuit is disposed respectively in association with a match line ML and a sub-ground line MVSS.

More specifically, a P-channel MOS transistor 30 is disposed in association with the match line ML.

The P-channel MOS transistor 30 is disposed between a power supply voltage VDD and the match line ML. The gate of the P-channel MOS transistor 30 receives the input of a control signal PC.

An N-channel MOS transistor 31 is disposed in association with the sub-ground line MVSS.

The N-channel MOS transistor 31 is disposed between a ground voltage VSS and the sub-ground line MVSS. The gate of the N-channel MOS transistor 31 receives the input of a control signal /PC. The control signal /PC is an inversion (complementary signal) of the control signal PC.

For example, before a search operation, the control signals PC, /PC are respectively set to the "L" level and the "H" level.

A precharge is performed when the control signal PC is at the "L" level and the control signal /PC is at the "H" level.

The match line ML is coupled to the power supply voltage VDD. Further, the sub-ground line MVSS is coupled to the ground voltage VSS. That is to say, the match line ML is precharged to a first potential, and the sub-ground line MVSS is precharged to a second potential.

Meanwhile, during a search operation, the control signal PC is set to the "H" level, and the control signal /PC is set to the "L" level. This turns off the P-channel MOS transistor 30, and turns off the N-channel MOS transistor 31.

Consequently, the match line ML and the sub-ground line MVSS are placed in the open state.

Figure 6:
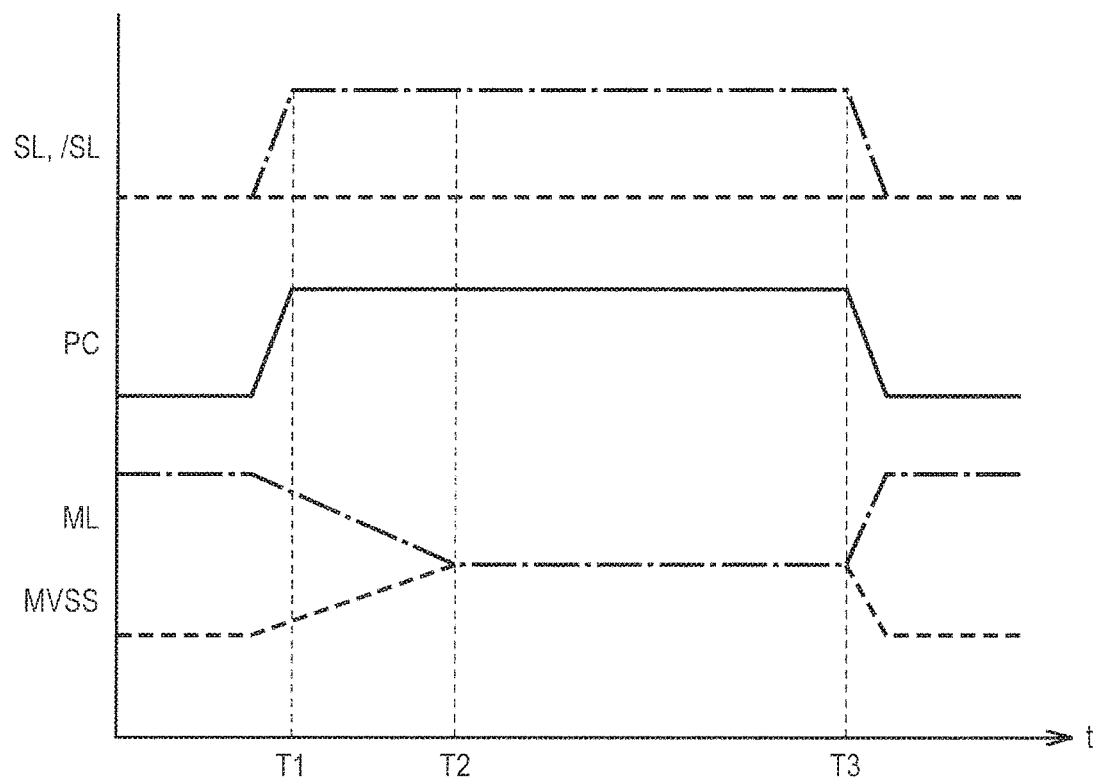
FIG. 6 is a diagram illustrating the potential of a match line according to the first embodiment.

FIG. 6 is a diagram illustrating the potential of the match line according to the first embodiment.

As illustrated in FIG. 6, the control signal PC is set to the "L" level before time T1.

Consequently, the match line ML is coupled to the power supply voltage VDD, and the sub-ground line MVSS is coupled to the ground voltage VSS.

The match line ML and the sub-ground line MVSS are precharged.

At time T1, the control signal PC is changed from the "L" level to the "H" level. A search operation is then executed in accordance with the pair of search lines SL, /SL.

In the present example, it is assumed, for instance, that the search data is mismatched during a search operation.

In this case, the match line ML and the sub-ground line MVSS are electrically coupled. Therefore, the match line ML and the sub-ground line MVSS are set to an intermediate potential that is intermediate between the first potential and the second potential. If, by contrast, the search data is matched during a search operation, the match line ML is maintained at the first potential. This makes it possible to determine whether or not the search data is matched.

Subsequently, at time T3, the control signal PC is changed from the "H" level to the "L" level.

Accordingly, the match line ML is coupled to the power supply voltage VDD, and the sub-ground line MVSS is coupled to the ground voltage VSS. The match line ML and the sub-ground line MVSS are precharged.

The match line ML is precharged from the intermediate potential between the first potential and the second potential.

As the match line ML is not precharged from the ground voltage VSS, but is precharged from the intermediate potential, it is possible to reduce the power consumption required for precharging the match line ML.

The majority of the match lines ML of the search memory 8 need to be precharged due to a search data mismatch during a search operation. However, the required precharge is from the intermediate potential to the power supply voltage VDD. Therefore, the overall power consumption can be significantly reduced.

Second Embodiment

Figure 7:
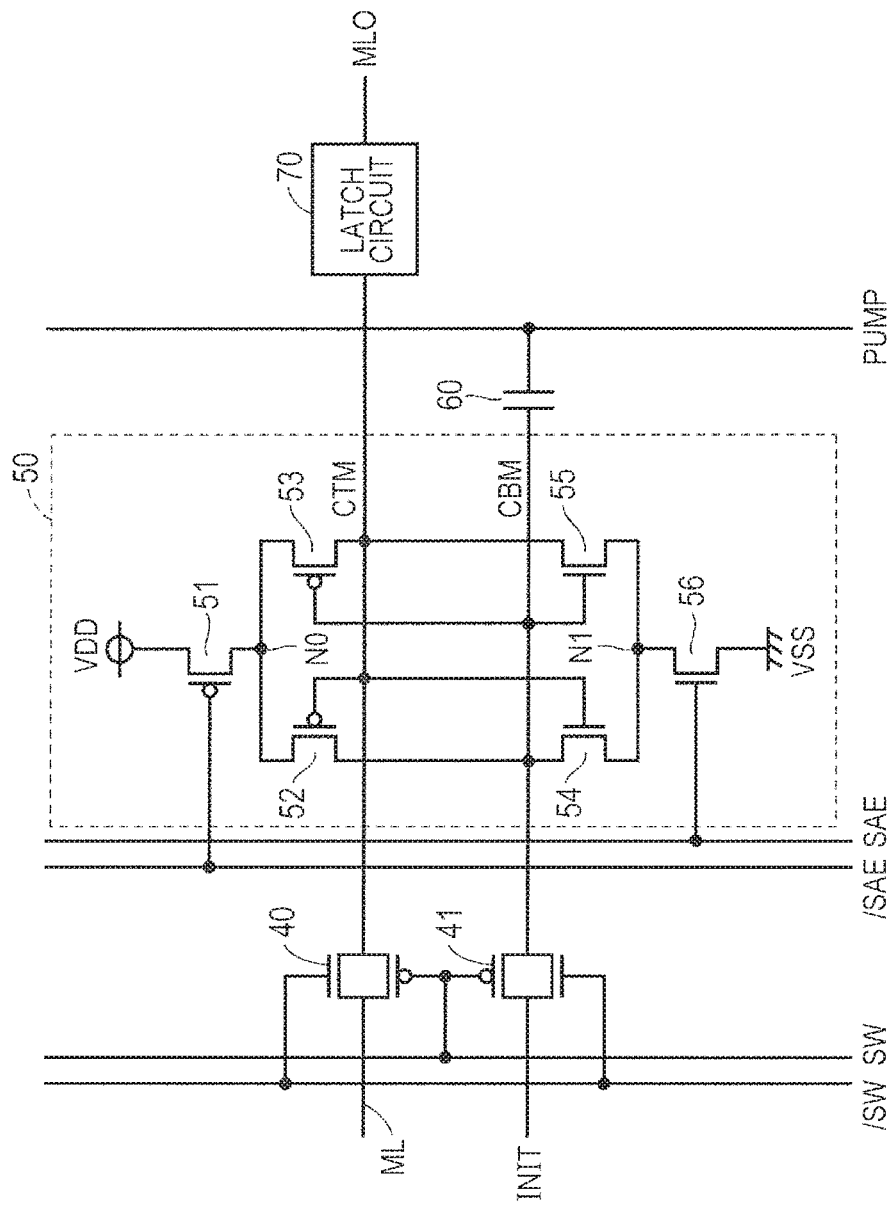
FIG. 7 is a diagram illustrating a circuit configuration of a match amplifier according to a second embodiment.

FIG. 7 is a diagram illustrating a circuit configuration of a match amplifier MA according to a second embodiment.

Referring to FIG. 7, the match amplifier MA includes transfer gates 40, 41, a sense amplifier 50, a capacitor 60, and a latch circuit 70.

The transfer gate 40 is disposed between a match line ML and an input node CTM of the sense amplifier 50.

The transfer gate 40 operates in accordance with control signals SW, /SW.

The transfer gate 41 is disposed between an input node CBM and a signal line INIT to which a reference voltage is supplied.

The transfer gate 41 operates in accordance with the control signals SW, /SW.

When the control signals SW, /SW are respectively set to the "L" level and the "H" level, the transfer gates 40, 41 turn on. This couples the match line ML to the input node CTM, and couples the signal line INIT to the input node CBM.

When, by contrast, the control signals SW, /SW are respectively set to the "H" level and the "L" level, the transfer gates 40, 41 turn off. This electrically uncouples the match line ML from the input node CTM, and electrically uncouples the signal line INIT from the input node CBM.

The sense amplifier 50 includes P-channel MOS transistors 51-53 and N-channel MOS transistors 54-56.

The P-channel MOS transistor 51 is disposed between the power supply voltage VDD and a power supply node N0. The gate of the P-channel MOS transistor 51 receives the input of a control signal /SAE.

The P-channel MOS transistor 52 is disposed between the power supply node N0 and the input node CBM. The gate of the P-channel MOS transistor 52 is coupled to the input node CTM.

The P-channel MOS transistor 53 is disposed between the power supply node N0 and the input node CTM. The gate of the P-channel MOS transistor 53 is coupled to the input node CBM.

The N-channel MOS transistor 56 is disposed between the ground voltage VSS and a ground node N1. The gate of the N-channel MOS transistor 56 receives the input of a control signal SAE.

The N-channel MOS transistor 54 is disposed between the ground node N1 and the input node CBM. The gate of the N-channel MOS transistor 54 is coupled to the input node CTM.

The N-channel MOS transistor 55 is disposed between the ground node N1 and the input node CTM. The gate of the N-channel MOS transistor 55 is coupled to the input node CBM.

When the control signals SAE, /SAE are respectively at the "H" level and the "L" level, the sense amplifier 50 is activated.

When the control signals SAE, /SAE are respectively at the "L" level and the "H" level, the sense amplifier 50 is deactivated.

The sense amplifier 50 amplifies the potential difference between the input node CTM and the input node CBM, and then outputs an amplified signal to the latch circuit 70.

The latch circuit 70 latches an "L" level or "H" level signal amplified by the sense amplifier 50, and outputs the latched signal as data MLO.

When the data MLO is at the "H" level, it signifies that the search data is matched.

When, by contrast, the data MLO is at the "L" level, it signifies that the search data is mismatched.

The capacitor 60 is disposed between the input node CBM and a signal line to which a control signal PUMP is inputted. The capacitor 60 is coupled at one end to the input node CBM and at the other end to the signal line to which the control signal PUMP is inputted.

The capacitor 60 is capable of adjusting the potential of the input node CBM.

Figure 8:
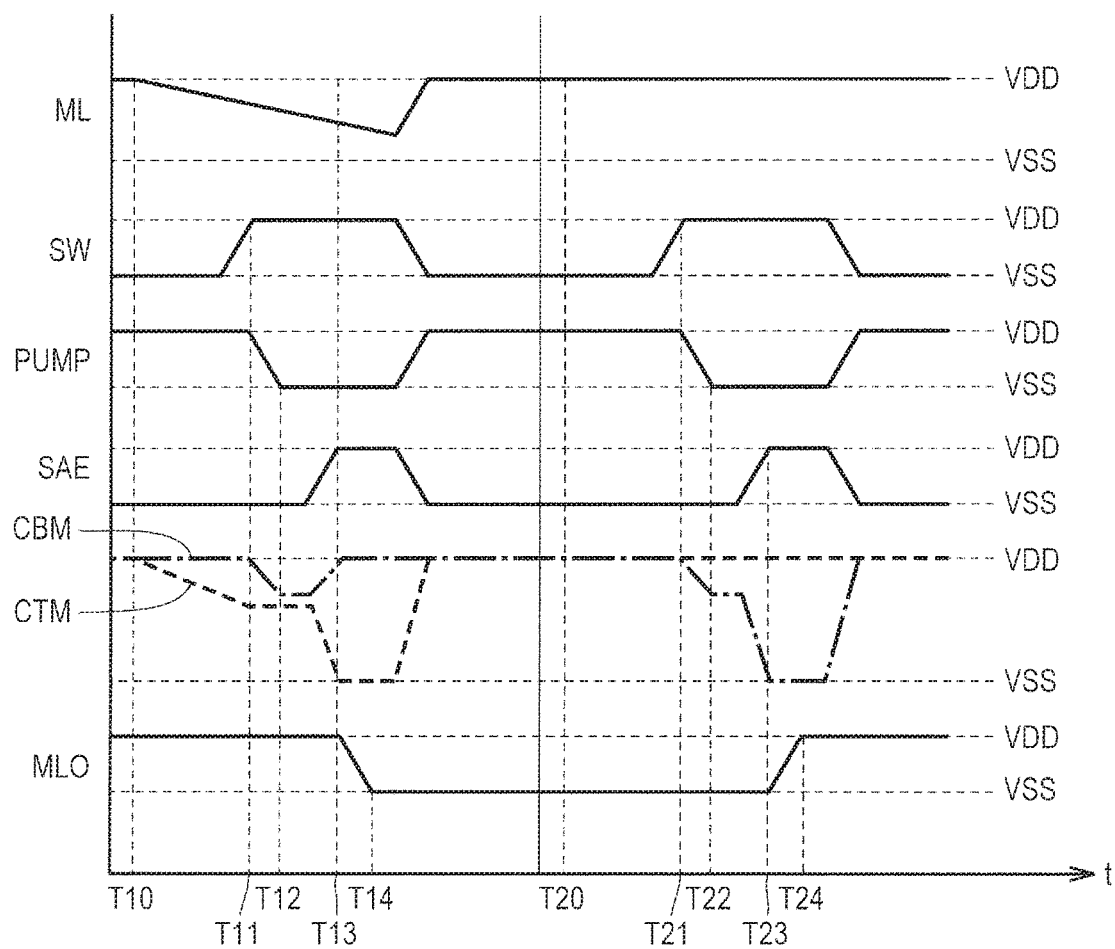
FIG. 8 is a timing diagram illustrating an operation of the match amplifier according to the second embodiment.

FIG. 8 is a timing diagram illustrating an operation of the match amplifier MA according to the second embodiment.

The following describes a case where the search data is mismatched.

As illustrated in FIG. 8, the potential of a match line ML decreases at time T10. Further, the control signals SW, /SW are respectively set to the "L" level" and the "H" level. Therefore, the match line ML is coupled to the input node CTM. Further, the signal line INIT is coupled to the input node CBM. Here, in the initial state, the power supply voltage VDD is inputted to the signal line INIT.

Consequently, when the potential of the match line ML decreases, the potential of the input node CTM in the sense amplifier 50 decreases. Meanwhile, the potential of the input node CBM is maintained.

At time T11, the control signals SW, /SW are respectively set to the "H" level and the "L" level. This turns off the transfer gates 40, 41.

Next, at time T12, the control signal PUMP is driven. More specifically, the control signal PUMP changes the signal line from the "H" level to the "L" level.

Consequently, the potential of the input node CBM is decreased to a predetermined potential level.

Next, at time T13, the control signals SAE, /SAE are respectively set to the "H" level and the "L" level. This activates the sense amplifier 50.

When the sense amplifier 50 is activated, the potential difference between the input node CTM and the input node CBM is amplified so that the input node CTM is set to the second potential of the ground voltage VSS, and that the input node CBM is set to the first potential of the power supply voltage VDD.

At time T14, the latch circuit 70 outputs the "L" level as the data MLO in accordance with the potential of the input node CTM.

The following describes a case where the search data is matched.

As illustrated in FIG. 8, at time T20, the potential of a match line ML is maintained. Further, the control signals SW, /SW are respectively set to the "L" level and the "H" level. Therefore, the match line ML is coupled to the input node CTM. Moreover, the signal line INIT is coupled to the input node CBM. Here, in the initial state, the power supply voltage VDD is inputted to the signal line INIT.

Consequently, the potential of the match line ML is maintained. Thus, the potentials of the input nodes CTM, CBM in the sense amplifier 50 are set to the first potential.

At time T21, the control signals SW, /SW are respectively set to the "H" level and the "L" level. This turns off the transfer gates 40, 41.

Next, at time T22, the control signal PUMP is driven. More specifically, the control signal PUMP changes the signal line from the "H" level to the "L" level.

Consequently, the potential of the input node CBM is decreased to the predetermined potential level.

Next, at time T23, the control signals SAE, /SAE are respectively set to the "H" level and the "L" level. This activates the sense amplifier 50.

When the sense amplifier 50 is activated, the potential difference between the input node CTM and the input node CBM is amplified so that the input node CTM is set to the first potential of the power supply voltage VDD, and that the input node CBM is set to the second potential of the ground voltage VSS.

At time T24, the latch circuit 70 outputs the "H" level as the data MLO in accordance with the potential of the input node CTM.

The sense amplifier 50 according to the second embodiment is capable of easily adjusting a reference potential of the input node CBM to be compared. More specifically, the reference potential of the input node CBM can be initially set to the first potential, and can be set to the intermediate potential between the first potential and the second potential by driving the control signal PUMP.

A voltage generation circuit for generating the reference voltage for comparison need not be provided. This makes it possible to reduce the footprint.

The second embodiment has been described on the assumption that the reference potential of the input node CBM is initially set to the first potential and is set to the intermediate potential between the first potential and the second potential by driving the control signal PUMP.

Meanwhile, an alternative is to initially set the reference potential of the input node CBM to the second potential, and set the reference potential of the input node CBM to the intermediate potential between the first potential and the second potential by driving the control signal PUMP. More specifically, the alternative is to input the ground voltage VSS to the signal line INIT and drive the control signal PUMP from the "L" level to the "H" level in order to raise the reference potential of the input node CBM from the second potential to the intermediate potential between the first potential and the second potential.

It should be noted that, when the search data is mismatched, the match amplifier MA according to the second embodiment is applicable to not only a case where the potential of the match line ML is set to the intermediate potential between the first potential and the second potential, but also a case where the potential of the match line ML is set to the second potential.

First Modification of Second Embodiment

Figure 9:
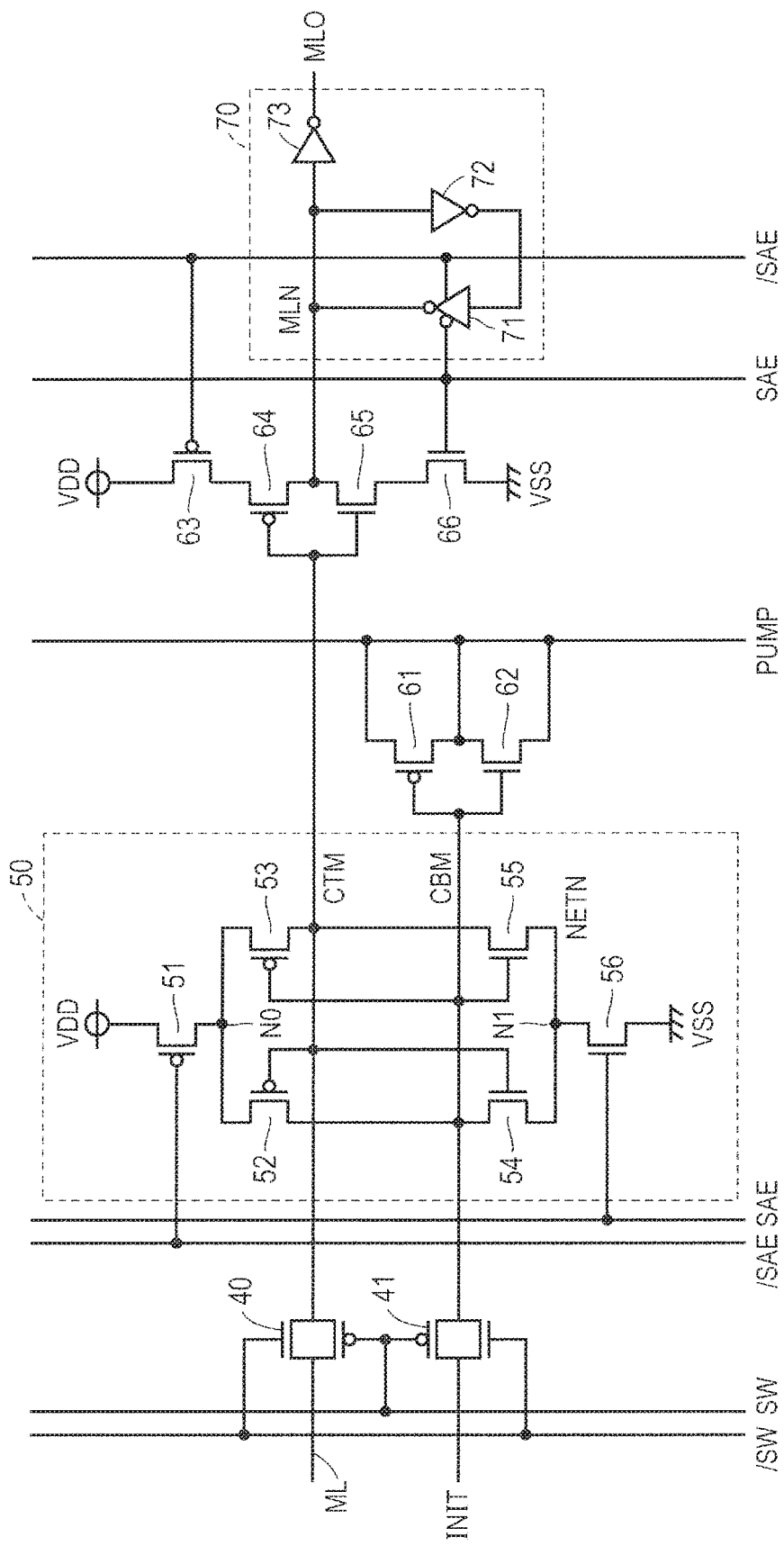
FIG. 9 is a diagram illustrating a circuit configuration of the match amplifier according to a first modification of the second embodiment.

FIG. 9 is a diagram illustrating a circuit configuration of the match amplifier MA according to a first modification of the second embodiment.

Referring to FIG. 9, the match amplifier MA according to the first modification of the second embodiment differs from the match amplifier MA described with reference to FIG. 8 in that the former additionally includes a P-channel MOS transistor 61, an N-channel MOS transistor 62, and a driver circuit in place of the capacitor 60. FIG. 9 also illustrates a detailed circuit configuration of the latch circuit 70. The other elements of these match amplifiers MA are similar to each other and will not be redundantly described in detail.

The latch circuit 70 includes inverters 71-73.

The inverter 72 inverts the signal of a node MLN and outputs the inverted signal to the inverter 71. The inverter 71 inverts the signal from the inverter 71 and outputs the inverted signal to the node MLN.

The inverters 71, 72 form a latch.

The inverter 73 inverts the signal of the node MLN and outputs the inverted signal as the data MLO.

The inverter 71 operates in accordance with inputs of the control signals SAE, /SAE.

More specifically, the inverter 71 is activated when the control signals SAE, /SAE are respectively at the "L" level and the "H" level. When, by contrast, the control signals SAE, /SAE are respectively at the "H" level and the "L" level, the inverter 71 is deactivated.

The P-channel MOS transistor 61 parallelly couples its source and drain to a signal line for driving the control signal PUMP. The gate of the P-channel MOS transistor 61 is coupled to the input node CBM.

The N-channel MOS transistor 62 parallelly couples its source and drain to the signal line for driving the control signal PUMP. The gate of the N-channel MOS transistor 62 is coupled to the input node CBM.

The P-channel MOS transistor 61 and the N-channel MOS transistor 62 function as a MOS capacitor.

Consequently, the circuit area can be reduced because there is no need to particularly design a capacitor.

Further, the driver circuit is disposed in the present example. More specifically, the driver circuit includes P-channel MOS transistors 63, 64 and N-channel MOS transistors 65, 66.

The P-channel MOS transistors 63, 64 are series-coupled between the power supply voltage VDD and the node MLN. The gate of the P-channel MOS transistor 63 receives the input of the control signal /SAE. The gate of the P-channel MOS transistor 64 is coupled to the input node CTM.

The N-channel MOS transistors 65, 66 are series-coupled between the node MLN and the ground voltage VSS. The gate of the N-channel MOS transistor 66 receives the input of the control signal SAE. The gate of the N-channel MOS transistor 65 is coupled to the input node CTM.

The driver circuit is activated in accordance with the inputs of the control signals SAE, /SAE.

More specifically, the driver circuit is activated when the control signals SAE, /SAE are respectively at the "H" level and the "L" level. That is to say, the P-channel MOS transistor 63 and the N-channel MOS transistor 66 turn on.

When, by contrast, the control signals SAE, /SAE are respectively at the "L" level and the "H" level, the driver circuit is deactivated. That is to say, the P-channel MOS transistor 63 and the N-channel MOS transistor 66 turn off.

In the above-described configuration, the P-channel MOS transistors and N-channel MOS transistors to be coupled to the input node CTM in the sense amplifier 50 are equal in number to the P-channel MOS transistors and N-channel MOS transistors to be coupled to the input node CBM.

Consequently, the same number of transistors are coupled to the input nodes in the sense amplifier 50 so that symmetry is maintained. This makes it possible to improve the operating margin of the sense amplifier 50.

FIGS. 10A to 10C are diagrams illustrating a layout configuration of a MOS transistor according to the first modification of the second embodiment.

In the present example, the MOS transistor is formed of a FinFET.

Referring to FIG. 10A, the N-channel MOS transistor is formed in a P-well (PW) region that is formed over a P-type substrate (Psub).

The P-channel MOS transistor is formed in an N-well (NW) region.

In a P-well, N-type (n+) impurity regions (source region and drain region) are formed. A fin is formed over the P-well in such a manner as to couple such impurity regions. Polysilicon is used to form a gate in such a manner as to stride over the fin between the source region and the drain region with a gate oxide film positioned in-between. A metal wiring layer is formed over the gate. A source metal wiring layer and a drain metal wiring layer are formed over the source region and the drain region (n+). The top of the gate metal wiring layer, the top of the source metal wiring layer, and the top of the drain metal wiring layer are each coupled to an upper metal wiring layer through a via.

A detailed description is given below.

The N-channel MOS transistors 65, 66 will now be described.

Polysilicons P1-P4 are formed in such a manner as to stride over two fins F1, F2 disposed in the P-well.

The polysilicon P2 is formed as the gate of the N-channel MOS transistor 66.

The polysilicon P3 is formed as the gate of the N-channel MOS transistor 65.

A metal M0 is disposed as the source region of the N-channel MOS transistor 66.

The metal M0 is coupled to the upper metal wiring layer through a via V1.

The drain region of the N-channel MOS transistor 66 and the source region of the N-channel MOS transistor 65 are coupled with the fins F1, F2.

A metal M1 is disposed as the drain region of the N-channel MOS transistor 65.

The metal M1 is coupled to the upper metal wiring layer through a via V2.

The polysilicon P2 of the N-channel MOS transistor 66 is coupled to a metal M2 and coupled to the upper metal wiring layer through a via V3.

The P-channel MOS transistors 63, 64 will now be described.

Polysilicons P2-P5 are formed in such a manner as to stride over two fins F5, F6 disposed in an N-well. The polysilicons P2-P4 are formed commonly with the N-channel MOS transistors 65, 66.

The polysilicon P3 is formed as the gate of the P-channel MOS transistor 64.

The polysilicon P4 is formed as the gate of the P-channel MOS transistor 63.

A metal M4 is disposed as the source region of the P-channel MOS transistor 64.

The metal M4 is coupled to the upper metal wiring layer through a via V5.

The drain region of the P-channel MOS transistor 63 and the source region of the P-channel MOS transistor 64 are coupled with the fins F5, F6.

A metal M5 is disposed as the source region of the P-channel MOS transistor 63.

The metal M5 is coupled to the upper metal wiring layer through a via V6.

The metal M2 is disposed as the drain region of the P-channel MOS transistor 64.

The metal M2 is coupled to the upper metal wiring layer through the via V5.

The polysilicon P4 of the P-channel MOS transistor 63 is coupled to a metal M3, and coupled to the upper metal wiring layer through a via V4.

The P-channel MOS transistors 51-53 will now be described.

Polysilicons P6-P8, P3 are formed in such a manner as to stride over two fins F3, F4 disposed in the N-well. The polysilicon P3 is formed commonly with the N-channel MOS transistor 65 and the P-channel MOS transistor 64.

The polysilicons P7, P8 are formed as the gate of the P-channel MOS transistor 51. The polysilicons P7, P8 are coupled to each other with a metal M6. The metal M6 is coupled to the upper metal wiring layer through a via V8.

Two metals M7, M9 are disposed as the source region of the P-channel MOS transistor 51. The metal M7 is coupled to the upper metal wiring layer through a via V7. The metal M9 is coupled to the upper metal wiring layer through a via V10.

A metal M8 is disposed as the drain region of the P-channel MOS transistor 51. The metal M8 is coupled to the upper metal wiring layer through a via V9.

Polysilicons P9, P10, P3, P11 are formed in such a manner as to stride over two fins F7, F8 disposed in the N-well. The polysilicon P3 is formed commonly, for example, with the N-channel MOS transistor 65 and the P-channel MOS transistor 64.

The polysilicon P10 is formed as the gate of the P-channel MOS transistor 53.

The polysilicon P3 is formed as the gate of the P-channel MOS transistor 52.

A metal M12 is disposed as the source regions of the P-channel MOS transistors 52, 53. The metal M12 is coupled to the upper metal wiring layer through a via V13.

A metal M14 is disposed as the drain region of the P-channel MOS transistor 52. The metal M14 is coupled to the upper metal wiring layer through a via V14.

A metal M11 is disposed as the drain region of the P-channel MOS transistor 53. The metal M11 is coupled to the upper metal wiring layer through a via V12.

The polysilicon P3 of the P-channel MOS transistor 52 is coupled to a metal M10. The metal M10 is coupled to the upper metal wiring layer through a via V11.

The N-channel MOS transistors 54-56 will now be described.

The polysilicons P9, P10, P3, P11 are formed in such a manner as to stride over two fins F9, F10 disposed in the P-well. The polysilicons P9, P10, P3, P11 are formed commonly with the P-channel MOS transistors 52, 53.

The polysilicon P10 is formed as the gate of the N-channel MOS transistor 55.

The polysilicon P11 is formed as the gate of the N-channel MOS transistor 54.

A metal M13 is disposed as the source regions of the N-channel MOS transistors 54, 55. The metal M13 is coupled to the upper metal wiring layer through a via V16.

The metal M14 is disposed as the drain region of the N-channel MOS transistor 54.

The drain region of the P-channel MOS transistor 52 and the drain region of the N-channel MOS transistor 54 are coupled commonly with the metal M14.

The metal M11 is disposed as the drain region of the N-channel MOS transistor 55.

The drain region of the P-channel MOS transistor 53 and the drain region of the N-channel MOS transistor 55 are coupled commonly with the metal M11.

The polysilicon P10 is coupled to a metal M23. The metal M23 is coupled to the upper metal wiring layer through a via V15.

Polysilicons P10, P13, P14, P15 are formed in such a manner as to stride over two fins F11, F12 disposed in the P-well. The polysilicon P10 is formed commonly with the N-channel MOS transistor 55 and the P-channel MOS transistor 53.

The polysilicons P13, P14 are formed as the gate of the N-channel MOS transistor 56. The polysilicons P13, P14 are coupled to each other with a metal M18. The metal M18 is coupled to the upper metal wiring layer through a via V24.

Two metals M15, M17 are disposed as the source region of the N-channel MOS transistor 56. The metal M15 is coupled to the upper metal wiring layer through a via V17. The metal M17 is coupled to the upper metal wiring layer through a via V19.

A metal M16 is disposed as the drain region of the N-channel MOS transistor 56. The metal M16 is coupled to the upper metal wiring layer through a via V18.

Polysilicons P16, P10, P17 are formed in such a manner as to stride over two fins F13, F14 disposed in the P-well.

The polysilicon P10 is formed commonly with the N-channel MOS transistor 55 and the P-channel MOS transistor 53.

The polysilicon P10 is formed as the gate of the N-channel MOS transistor 62.

A metal M20 is disposed as the source region of the N-channel MOS transistor 62. The metal M20 is coupled to the upper metal wiring layer through a via V21.

A metal M19 is disposed as the drain region of the N-channel MOS transistor 62. The metal M19 is coupled to the upper metal wiring layer through a via V20.

The polysilicons P16, P10, P17 are formed in such a manner as to stride over two fins F15, F16 disposed in the N-well.

The polysilicons P16, P10, P17 are formed commonly with the N-channel MOS transistor 62.

The polysilicon P10 is formed as the gate of the P-channel MOS transistor 61.

A metal M22 is disposed as the source region of the P-channel MOS transistor 61. The metal M22 is coupled to the upper metal wiring layer through a via V23.

A metal M21 is disposed as the drain region of the P-channel MOS transistor 61. The metal M21 is coupled to the upper metal wiring layer through a via V22.

Referring to FIG. 10B, there is depicted a second metal wiring layer.

A metal M30 is coupled to the metal M0 through the via V1.

The metal M30 is further coupled to the upper metal wiring layer to receive the supply of the ground voltage VSS.

The metal M2 is coupled to a metal M31 through the via V3. The metal M31 is further coupled to the upper metal wiring layer to receive the input of the control signal SAE.

A metal M32 is coupled to the metal M1 through the via V2.

The metal M32 is coupled to the metal M4 through the via V5.

The metal M32 electrically couples the drain region of the P-channel MOS transistor 64 to the drain region of the N-channel MOS transistor 65. The metal M32 forms the node MLN.

A metal M33 is coupled to the metal M3 through the via V4. The metal M33 is further coupled to the upper metal wiring layer to receive the input of the control signal /SAE.

A metal M34 is coupled to the metal M5 through the via V6.

A metal M36 is coupled to the metal M7 through the via V7.

A metal M37 is coupled to the metal M9 through the via V10. The metals M34, M36, M37 are further coupled to the upper metal wiring layer to receive the supply of the power supply voltage VDD.

A metal M35 is coupled to the metal M6 through the via V8. The metal M35 is further coupled to the upper metal wiring layer to receive the input of the control signal SAE.

A metal M38 is coupled to the metal M8 through the via V9. The metal M38 is coupled to the metal M12 through the via V13. The metal M38 is further coupled to the upper metal wiring layer to form the node N0.

A metal M39 is coupled to the metal M10 through the via V11. The metal M39 is coupled to the metal M11 through the via V12. The metal M39 is further coupled to the upper metal wiring layer to form the input node CTM.

A metal M40 is coupled to the metal M14 through the via V14. The metal M40 is coupled to the metal M23 through the via V16. The metal M40 is further coupled to the upper metal wiring layer to form the input node CBM.

A metal M41 is coupled to the metal M13 through the via V15. The metal M41 is coupled to the metal M16 through the via V18. The metal M41 is further coupled to the upper metal wiring layer to form the node N1.

A metal M42 is coupled to the metal M17 through the via V19.

A metal M43 is coupled to the metal M15 through the via V17. The metals M42, M43 are further coupled to the upper metal wiring layer to receive the supply of the ground voltage VSS.

A metal M44 is coupled to the metal M18 through the via V24. The metal M44 is further coupled to the upper metal wiring layer to receive the input of the control signal SAE.

A metal M45 is coupled to the metal M15 through the via V20. The metal M45 is coupled to the metal M20 through the via V21. The metal 45 is coupled to the metal M21 through the via V22. The metal M45 is coupled to the metal M22 through the via V23.

The metal M45 is further coupled to the upper metal wiring layer to receive the input of the control signal PUMP.

Referring to FIG. 10C, there are depicted third and fourth metal wiring layers.

Metals M53-M55 and metals M58-M63 are the third metal wiring layers.

More specifically, the metal M53 is a signal line to which the control signal /SAE is inputted. The signal line and the metal M33 are coupled through an undepicted via.

The metal M54 is a signal line to which the control signal SAE is inputted. The signal line and the metal M31 are coupled through an undepicted via.

The metal M55 is a signal line to which the control signal /SAE is inputted. The signal line and the metal M35 are coupled through an undepicted via.

The metal M58 is a signal line to which the control signal SAE is inputted. The signal line and the metal M44 are coupled through an undepicted via.

The metal M59 is a signal line to which the control signal PUMP is inputted. The signal line and the metal M45 are coupled through an undepicted via.

The metal M60 is a signal line to which the ground voltage VSS is supplied. The signal line and the metals M42, M43 are coupled through an undepicted via.

The metal M61 is a signal line to which the power supply voltage VDD is supplied. The signal line and the metals M36, M37 are coupled through an undepicted via.

The metal M62 is a signal line to which the power supply voltage VDD is supplied. The signal line and the metal M34 are coupled through an undepicted via.

The metal M63 is a signal line to which the ground voltage VSS is supplied. The signal line and the metal M30 are coupled through an undepicted via.

Metals M50-M52, M56, M57 are the fourth metal wiring layers.

The metal M50 is a signal line to which the ground voltage VSS is supplied. The signal line and the metal M63 are coupled through an undepicted via.

The metal M51 is a signal line to which the power supply voltage VDD is supplied. The signal line and the metals M61, M62 are coupled through an undepicted via.

The metal M52 is a signal line to which the ground voltage VSS is supplied. The signal line and the metal M60 are coupled through an undepicted via.

The metal M59 is a signal line to which the control signal PUMP is inputted. The signal line and the metal M45 are coupled through an undepicted via.

The metal M56 is coupled to the metal M39 through an undepicted via to form the input node CTM.

The metal M57 is coupled to the metal M40 through an undepicted via to form the input node CBM.

Second Modification of Second Embodiment

Figure 11:
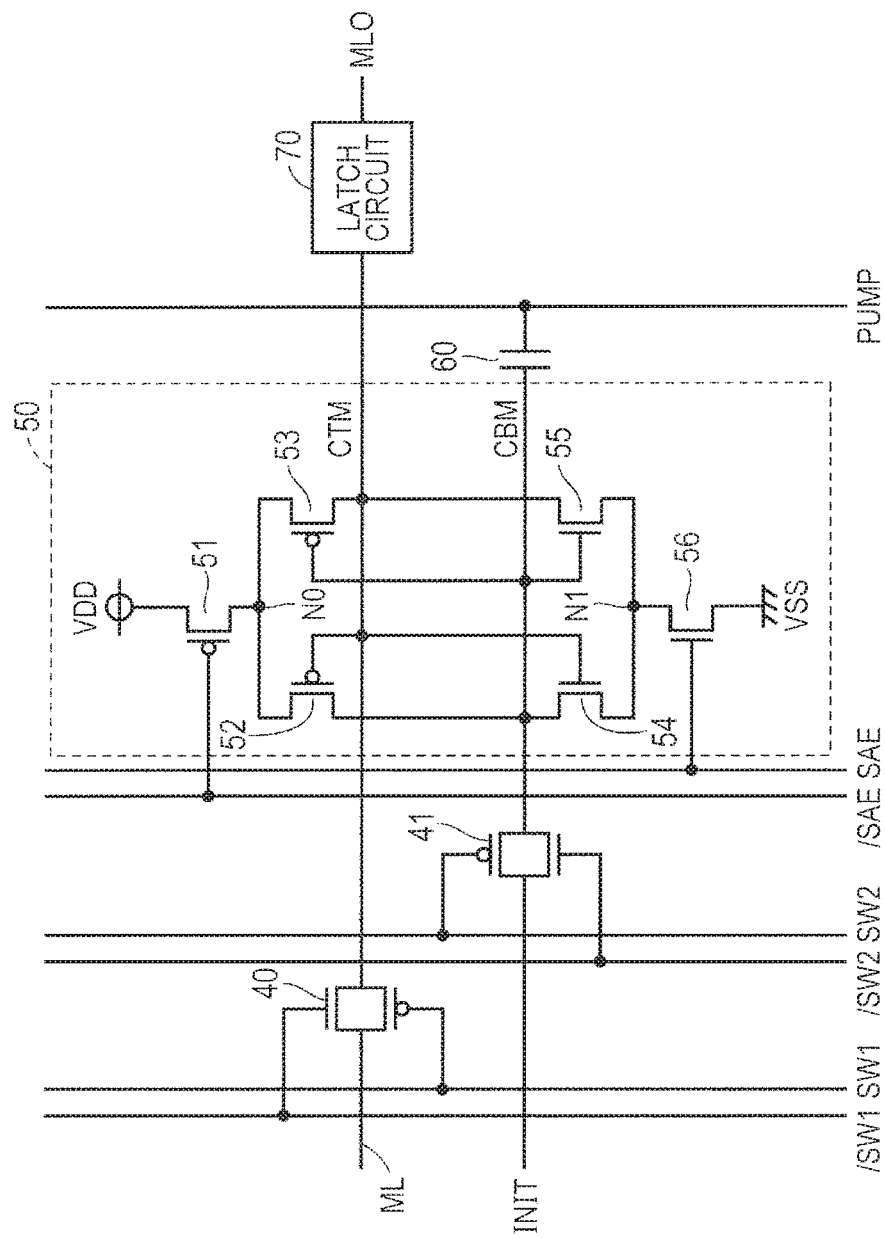
FIG. 11 is a diagram illustrating a circuit configuration of the match amplifier according to a second modification of the second embodiment.

FIG. 11 is a diagram illustrating a circuit configuration of the match amplifier MA according to a second modification of the second embodiment.

Referring to FIG. 11, the match amplifier MA according to the second modification of the second embodiment differs from the match amplifier MA described with reference to FIG. 8 in that control signals SW1, /SW1 are inputted to the transfer gate 40, and that control signals SW2, /SW2 are inputted to the transfer gate 41. The other elements of these match amplifiers MA are similar to each other and will not be redundantly described in detail.

Figure 12:
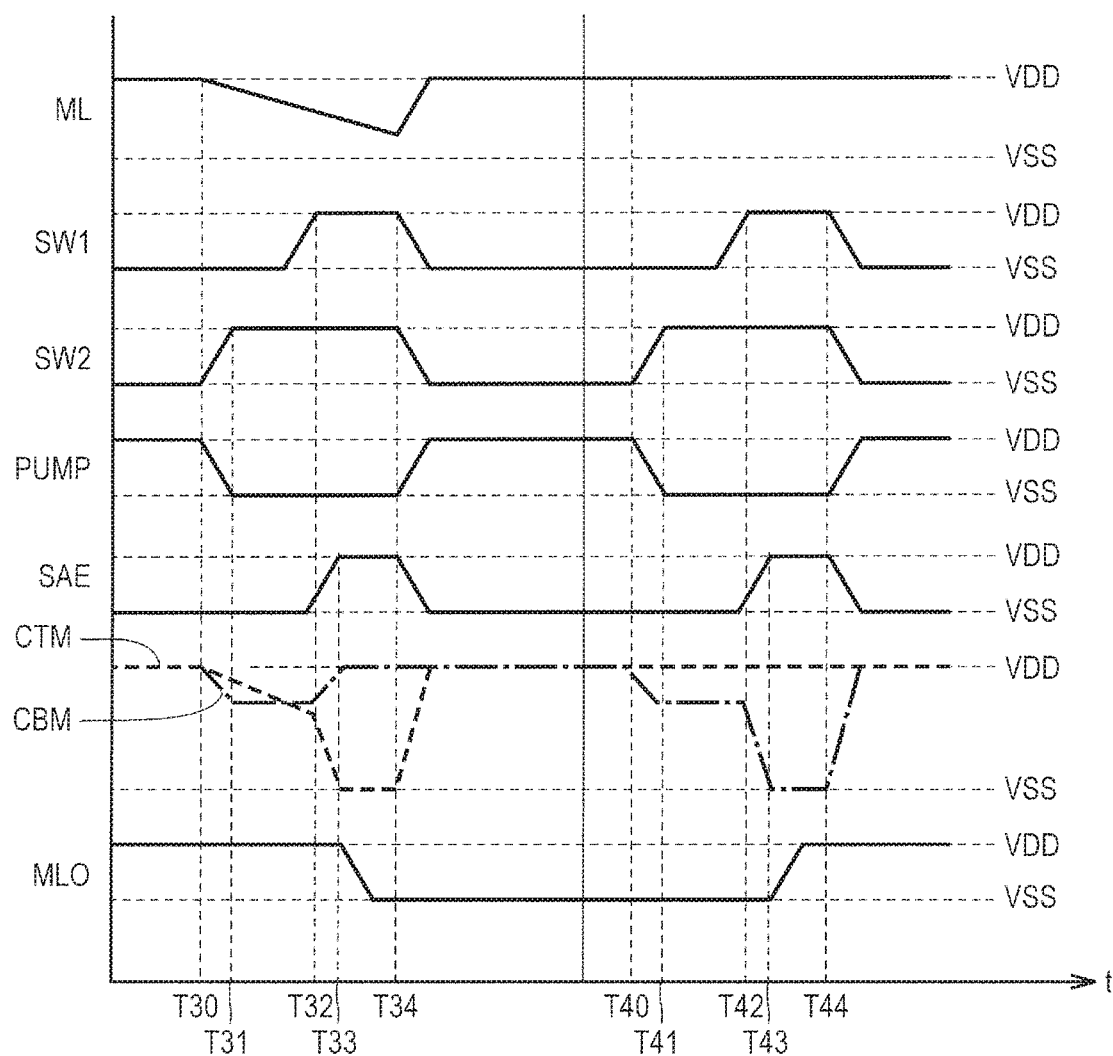
FIG. 12 is a timing diagram illustrating an operation of the match amplifier according to the second modification of the second embodiment.

FIG. 12 is a timing diagram illustrating an operation of the match amplifier MA according to the second modification of the second embodiment.

The following describes a case where the search data is mismatched.

As illustrated in FIG. 12, the potential of a match line ML decreases at time T30. Further, the control signals SW1, /SW1 are respectively set to the "L" level" and the "H" level. Therefore, the transfer gate 40 is on so that the match line ML is coupled to the input node CTM.

Consequently, when the potential of the match line ML decreases, the potential of the input node CTM in the sense amplifier 50 decreases.

At time T31, the control signals SW2, /SW2 are respectively set to the "H" level and the "L" level. This turns off the transfer gate 41.

In the initial state, the power supply voltage VDD is inputted to the signal line INIT. Therefore, when the transfer gate 41 turns off, the input node CBM is placed in the open state. Then, at time T31, the control signal PUMP is driven. More specifically, the control signal PUMP changes the signal line from the "H" level to the "L" level.

Consequently, the potential of the input node CBM is decreased to the predetermined potential level.

Next, at time T32, the control signals SW1, /SW1 are respectively set to the "H" level and the "L" level. This turns off the transfer gate 40.

Next, at time T33, the control signals SAE, /SAE are respectively set to the "H" level and the "L" level. This activates the sense amplifier 50.

When the sense amplifier 50 is activated, the potential difference between the input node CTM and the input node CBM is amplified so that the input node CTM is set to the second potential of the ground voltage VSS, and that the input node CBM is set to the first potential of the power supply voltage VDD.

At time T34, the latch circuit 70 outputs the "L" level as the data MLO in accordance with the potential of the input node CTM.

The following describes a case where the search data is matched.

As illustrated in FIG. 12, at time T40, the potential of a match line ML is maintained. Further, the control signals SW1, /SW1 are respectively set to the "L" level and the "H" level. Therefore, the transfer gate 40 is on so that the match line ML is coupled to the input node CTM.

At time T41, the control signals SW2, /SW2 are respectively set to the "H" level and the "L" level. This turns off the transfer gate 41.

In the initial state, the power supply voltage VDD is inputted to the signal line INIT. Therefore, when the transfer gate 41 turns off, the input node CBM is placed in the open state.

Then, at time T41, the control signal PUMP is driven. More specifically, the control signal PUMP changes the signal line from the "H" level to the "L" level.

Consequently, the potential of the input node CBM is decreased to the predetermined potential level.

Next, at time T42, the control signals SW1, /SW1 are respectively set to the "H" level and the "L" level. This turns off the transfer gate 40.

Next, at time T43, the control signals SAE, /SAE are respectively set to the "H" level and the "L" level. This activates the sense amplifier 50.

When the sense amplifier 50 is activated, the potential difference between the input node CTM and the input node CBM is amplified so that the input node CTM is set to the second potential of the ground voltage VSS, and that the input node CBM is set to the first potential of the power supply voltage VDD.

At time T44, the latch circuit 70 outputs the "H" level as the data MLO in accordance with the potential of the input node CTM.

Third Embodiment

Figure 13:
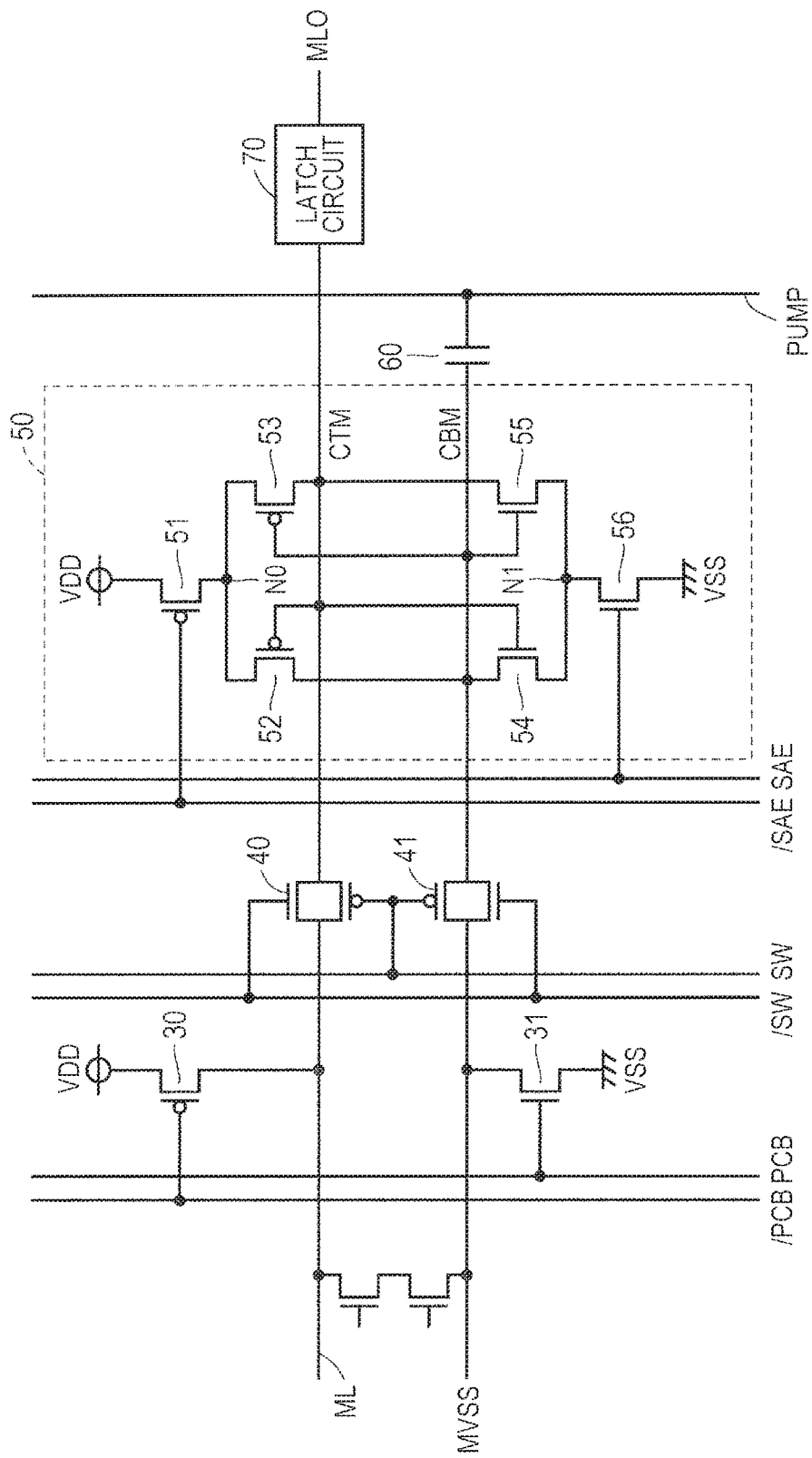
FIG. 13 is a diagram illustrating a circuit configuration of the match amplifier according to a third embodiment.

FIG. 13 is a diagram illustrating a circuit configuration of the match amplifier MA according to a third embodiment.

Referring to FIG. 13, the match amplifier MA according to the third embodiment differs from the match amplifier MA described with reference to FIG. 7 in that the signal line INIT is replaced by the sub-ground line MVSS. The other elements of these match amplifiers MA are similar to each other and will not be redundantly described in detail.

Figure 14:
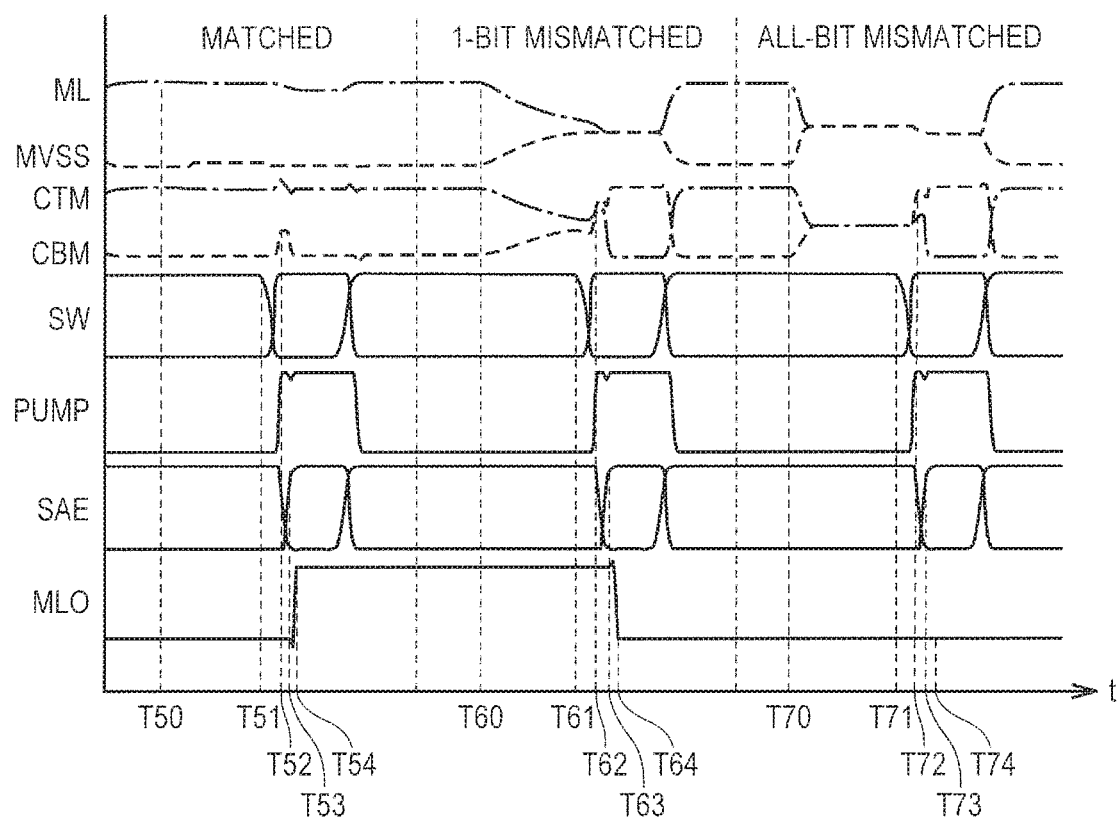
FIG. 14 is a timing diagram illustrating an operation of the match amplifier according to the third embodiment.

FIG. 14 is a timing diagram illustrating an operation of the match amplifier MA according to the third embodiment.

The following describes a case where the search data is matched.

As illustrated in FIG. 14, the potential of a match line ML is maintained. Further, the control signals SW, /SW are respectively set to the "L" level" and the "H" level. Therefore, the transfer gate 40 is on so that the match line ML is coupled to the input node CTM. The transfer gate 41 is on so that the sub-ground line MVSS is coupled to the input node CBM.

In the above case, the sub-ground line MVSS is precharged to the ground voltage VSS.

At time T51, the control signals SW, /SW are respectively set to the "H" level and the "L" level. This turns off the transfer gates 40, 41.

Next, at time T52, the control signal PUMP is driven. More specifically, the control signal PUMP changes the signal line from the "L" level to the "H" level.

Consequently, the potential of the input node CBM is increased to the predetermined potential level.

Next, at time T53, the control signals SAE, /SAE are respectively set to the "H" level and the "L" level. This activates the sense amplifier 50.

When the sense amplifier 50 is activated, the potential difference between the input node CTM and the input node CBM is amplified so that the input node CTM is set to the second potential of the ground voltage VSS, and that the input node CBM is set to the first potential of the power supply voltage VDD.

At time T54, the latch circuit 70 outputs the "H" level as the data MLO in accordance with the potential of the input node CTM.

The following describes a case where the search data is 1-bit mismatched.

As illustrated in FIG. 14, at time T60, the potential of a match line ML begins to decrease. Further, the control signals SW, /SW are respectively set to the "L" level and the "H" level. Therefore, the transfer gate 40 is on so that the match line ML is coupled to the input node CTM. The transfer gate 41 is on so that the sub-ground line MVSS is coupled to the input node CBM.

Consequently, when the potential of the match line ML decreases, the potential of the input node CTM in the sense amplifier 50 decreases.

As the match line ML is coupled to the sub-ground line MVSS, the potentials of the match line ML and sub-ground line MVSS change to the intermediate potential.

At time T61, the control signals SW, /SW are respectively set to the "H" level and the "L" level. This turns off the transfer gates 40, 41.

Next, at time T62, the control signal PUMP is driven. More specifically, the control signal PUMP changes the signal line from the "L" level to the "H" level.

Next, at time T63, the control signals SAE, /SAE are respectively set to the "H" level and the "L" level. This activates the sense amplifier 50.

When the sense amplifier 50 is activated, the potential difference between the input node CTM and the input node CBM is amplified so that the input node CTM is set to the second potential of the ground voltage VSS, and that the input node CBM is set to the first potential of the power supply voltage VDD.

At time T64, the latch circuit 70 outputs the "L" level as the data MLO in accordance with the potential of the input node CTM.

The following describes a case where the search data is all-bit mismatched.

As illustrated in FIG. 14, at time T70, the potential of a match line ML begins to decrease. Further, the control signals SW, /SW are respectively set to the "L" level and the "H" level. Therefore, the transfer gate 40 is on so that the match line ML is coupled to the input node CTM. The transfer gate 41 is on so that the sub-ground line MVSS is coupled to the input node CBM.

Consequently, when the potential of the match line ML decreases, the potential of the input node CTM in the sense amplifier 50 decreases.

As the match line ML is coupled to the sub-ground line MVSS, the potentials of the match line ML and sub-ground line MVSS change to the intermediate potential.

At time T71, the control signals SW, /SW are respectively set to the "H" level and the "L" level. This turns off the transfer gates 40, 41.

Next, at time T72, the control signal PUMP is driven. More specifically, the control signal PUMP changes the signal line from the "L" level to the "H" level.

Next, at time T73, the control signals SAE, /SAE are respectively set to the "H" level and the "L" level. This activates the sense amplifier 50.

When the sense amplifier 50 is activated, the potential difference between the input node CTM and the input node CBM is amplified so that the input node CTM is set to the second potential of the ground voltage VSS, and that the input node CBM is set to the first potential of the power supply voltage VDD.

At time T74, the latch circuit 70 outputs the "L" level as the data MLO in accordance with the potential of the input node CTM.

The configuration according to the third embodiment replaces the signal line INIT by the sub-ground line MVSS and thus makes it possible to further decrease the number of parts and reduce the footprint.

Fourth Embodiment

The first embodiment has been described on the assumption that a 1-port TCAM cell is used as the search memory cell. However, a 2-port TCAM cell may be used as the search memory cell.

A fourth embodiment will now be described on the assumption that the search memory includes a 2-port TCAM cell.

Figure 15:
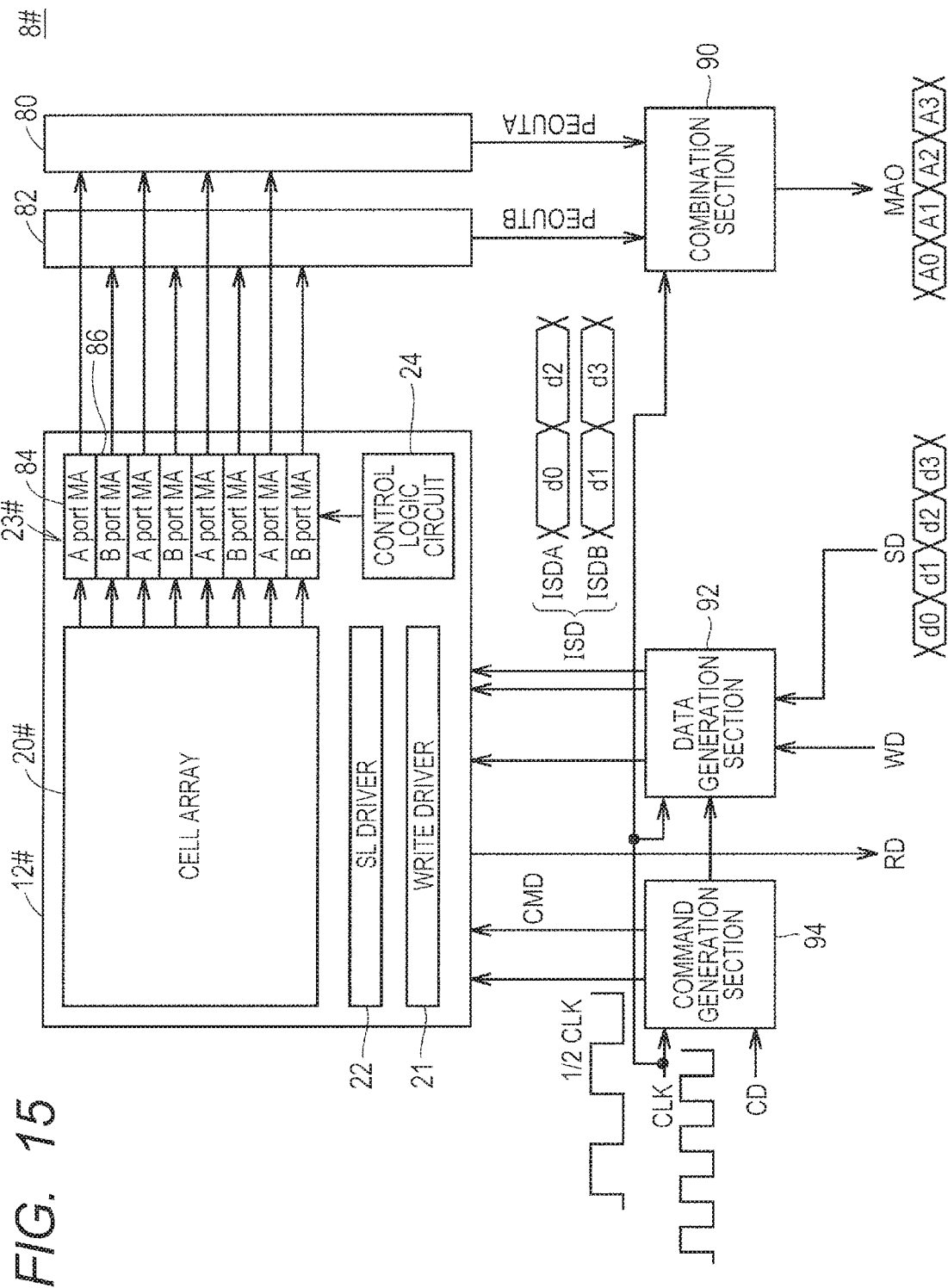
FIG. 15 is a diagram illustrating a configuration of the search memory according to a fourth embodiment.

FIG. 15 is a diagram illustrating a configuration of a search memory 8 # according to the fourth embodiment.

Referring to FIG. 15, the search memory 8 # includes a segment (subblock) 12 #, a data generation section 92, a command generation section 94, priority encoders 80, 82, and a combination section 90.

In synchronism with the input of a clock signal CLK, the command generation section 94 receives an external command CD, generates a command CMD for driving the segment 12 #, and outputs the generated command CMD together with a clock signal 1/2CLK.

The period of the clock signal 1/2CLK is equivalent to two times the period of the clock signal CLK.

In synchronism with the input of the clock signal CLK, the data generation section 92 generates external search data SD as internal search data ISD and outputs the generated internal search data ISD to the segment 12 #. More specifically, the data generation section 92 outputs the generated internal search data ISD to the search line driver group 22.

In synchronism with the input of the clock signal CLK, the data generation section 92 generates external write data WD as internal write data and outputs the generated internal write data to the segment 12 #. More specifically, the data generation section 92 outputs the generated internal write data to the write driver group 21.

The priority encoder 80 receives outputs from multiple port A match amplifiers 84 in the segment 12 #, and outputs highest-priority address information PEOUTA (hit index).

The priority encoder 82 receives outputs from multiple port B match amplifiers 84 in the segment 12 #, and outputs highest-priority address information PEOUTB (hit index).

In synchronism with the clock signal CLK, the combination section 90 combines the address information (hit index) from the priority encoders 80, 82, and outputs an external address output MAO.

The segment 12 # includes a TCAM cell array 20 #, the write driver group 21, the search line driver group 22, a match amplifier section 23 #, and the control logic circuit 24.

The TCAM cell array 20 # includes TCAM cells that are disposed in a matrix form (m rows and k columns).

During a write operation, the write driver group 21 supplies write data to each TCAM cell through the pair of bit lines BL, /BL. During a search operation, the search line driver group 22 supplies search data to each TCAM cell through the pair of search lines SL, /SL.

The control logic circuit 24 controls the overall operation of the segment 12 #. During a search operation, for example, the control logic circuit 24 receives a search command and outputs a control signal to the search line driver group 22 and the match amplifier section 23 # in order to control the operations of the search line driver group 22, the match amplifier section 23 #, and the precharge circuit.

The match amplifier section 23 # includes multiple match amplifiers that are associated with the rows of the cell array. In the present example, the match amplifier section 23 # includes multiple port A match amplifiers 84 and multiple port B match amplifiers 86 that are associated with respective rows of the cell array. During a search operation, the match amplifiers detect, in accordance with the potential of an associated match line ML, whether the associated portion of search data matches associated TCAM cell data.

The segment 12 # includes an undepicted sense amplifier, and outputs read data RD in accordance with a command.

Figure 16:
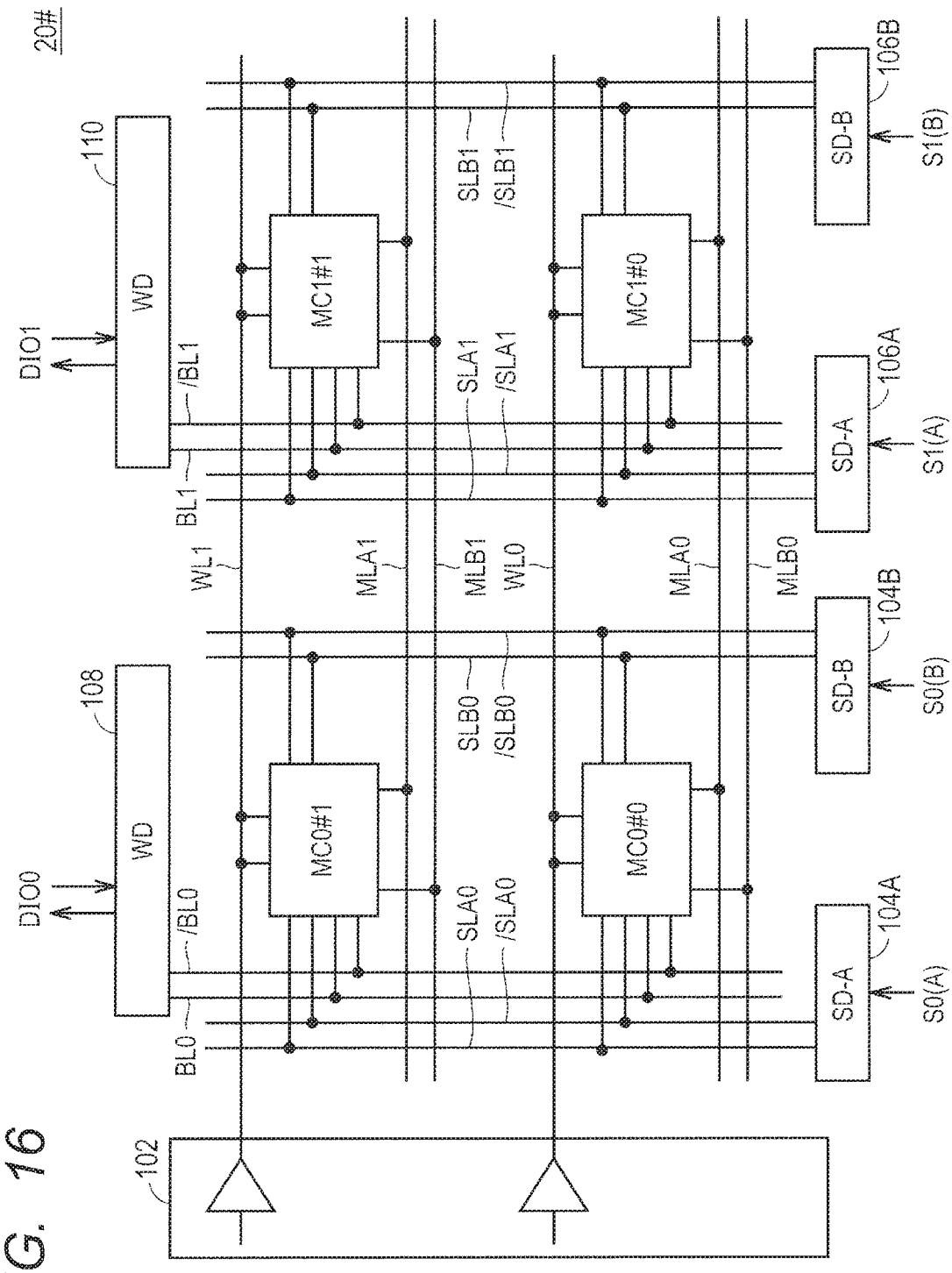
FIG. 16 is a diagram illustrating a TCAM cell array and its peripheral circuits according to the fourth embodiment.

FIG. 16 is a diagram illustrating the TCAM cell array 20 # and its peripheral circuits according to the fourth embodiment.

Referring to FIG. 16, the TCAM cell array 20 # includes memory cells MC0 #0-MC1 #1 that form a memory array. Here, #0-#1 are addresses called entries. For example, #0 represents address 0, and two TCAM cells, namely, the memory cells MC0 #0, MC1 #0, are simultaneously accessed during a data read operation or a data write operation.

Further, the area around the TCAM cell array 20 # includes a row decoder 102, search line drivers 104A, 104B, 106A, 106B, and write drivers 108, 110.

Although the memory array depicted in FIG. 1 is configured in a format of 2 columns by 2 rows for simplicity of explanation, the memory cell configuration to which the technology disclosed in this document is applicable is not limited to such a 2-column by 2-row format.

The row decoder 102 activates either one of word lines WL0, WL1 in accordance with an inputted address signal (not depicted).

The search line driver 104A drives a search line SLA0 to a level corresponding to a port A search data signal S0(A), and drives a search line /SLA0 to an inverted level. The search line driver 104B drives a search line SLB0 to a level corresponding to a port B search data signal S0(B), and drives a search line /SLB0 to an inverted level.

The search line driver 106A drives a search line SLA1 to a level corresponding to a port A search data signal S1(A), and drives a search line /SLA1 to an inverted level. The search line driver 106B drives a search line SLB1 to a level corresponding to a port B search data signal S1(B), and drives a search line /SLB1 to an inverted level.

The write driver 108 drives the pair of bit lines BL0, /BL0 in accordance with input data DIO0. This couples the write driver 108 to the pair of bit lines BL0, /BL0, and causes the write driver 108 to write data into each memory cell whose word line is activated. As is the case with the write driver 108, the write driver 110 drives the pair of bit lines BL1, /BL1 in accordance with input data DIO1.

The memory cells MC0 #0-MC1 #1 are each capable of holding 1-bit stored data. The stored data is to be compared with the search data.

Each memory cell is coupled to one word line, one bit line pair, two search line pairs, and two match lines. For example, the memory cell MC0 #0 is coupled to the pair of bit lines BL0, /BL0, the pair of search lines SLA0, /SLA0, the pair of search lines SLB0, /SLB0, and match lines MLA0, MLB0.

The pair of bit lines BL0, /BL0, the pair of search lines SLA0, /SLA0, and the pair of search lines SLB0, /SLB0 are commonly coupled to the memory cells MC0 #0, MC0 #1 in the first column. The pair of bit lines BL1, /BL1, the pair of search lines SLA1, /SLA1, and the pair of search lines SLB1, /SLB1 are commonly coupled to the memory cells MC1 #0, MC1 #1 in the second column.

The word line WL0 and the match lines MLA0, MLB0 are commonly coupled to the memory cells MC0 #0, MC1 #0 corresponding to the first row (address #0). The word line WL1 and match lines MLA1, MLB1 are commonly coupled to the memory cells MC0 #1, MC1 #1 corresponding to the second row (address #1).

Figure 17:
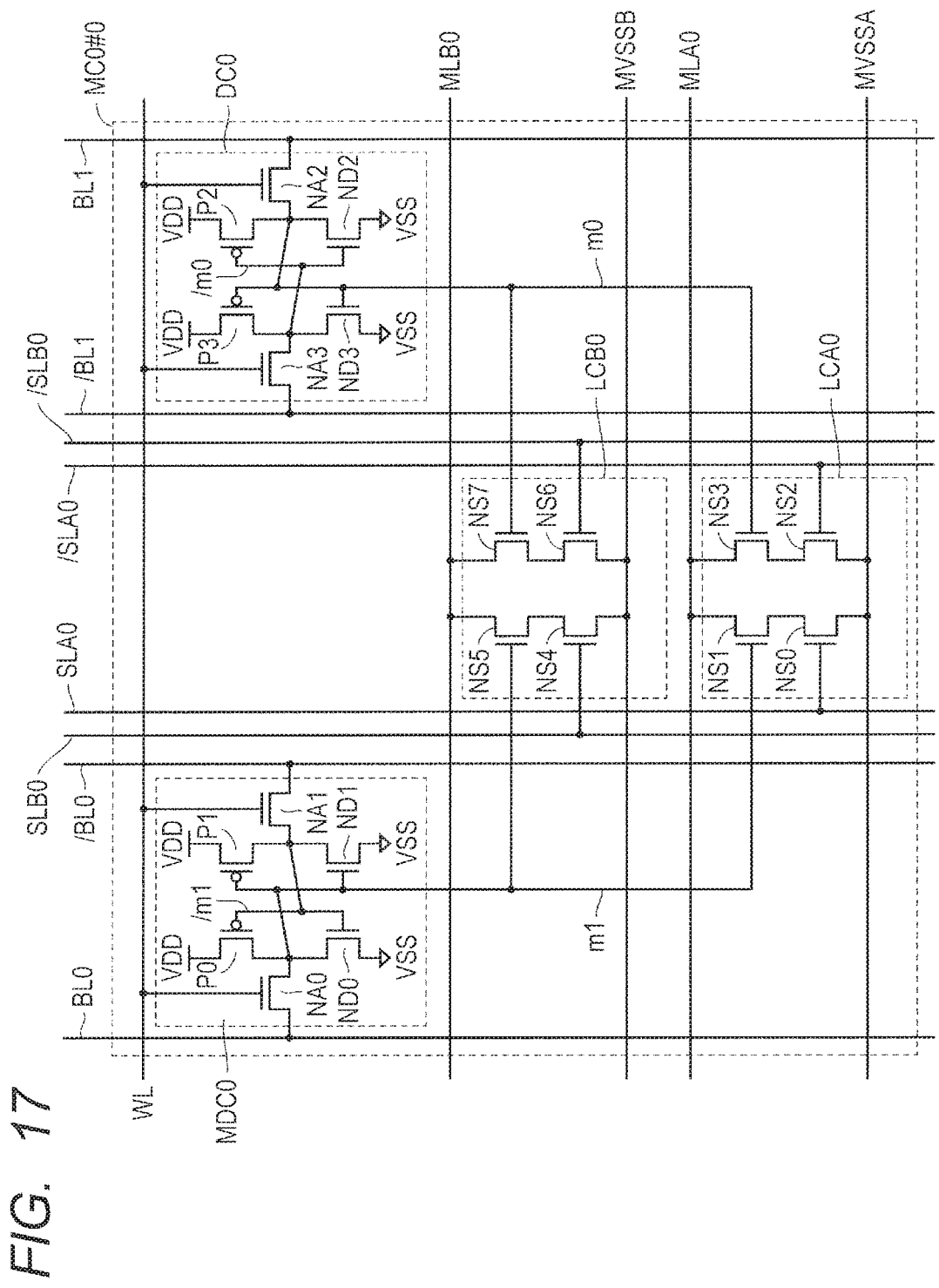
FIG. 17 is a diagram illustrating a 2-port TCAM cell according to the fourth embodiment.

FIG. 17 is a diagram illustrating the 2-port TCAM cell according to the fourth embodiment.

Referring to FIG. 17, the TCAM cell according to the fourth embodiment differs from the memory cell MC described with reference to FIG. 2 in that two SRAM cells (X cell and Y cell) are disposed adjacent to each other in the row direction (X direction). More specifically, and an X cell MDC0 and a Y cell DC0 are disposed.

The X cell and the Y cell are each capable of holding 1-bit stored data as mentioned above.

The memory cell MC0 #0 further includes the pairs of bit lines BL0, /BL0 and BL1, /BL1 that are extended along the column direction (Y direction).

The X cell MDC0 is formed of NMOS transistors NA0, NA1, ND0, ND1 and PMOS transistors P0, P1.

The NMOS transistor NA0 is coupled between a storage node m1 and the bit line BL0, and the word line WL0 is coupled to the gate of the NMOS transistor NA0. The NMOS transistor NA1 is coupled between a storage node /m1 and the bit line /BL0, and the word line WL0 is coupled to the gate of the NMOS transistor NA1. The PMOS transistor P0 is coupled between a power supply line VDD and the storage node m1, and the gate of PMOS transistor P0 is coupled to the storage node /m1. The NMOS transistor ND0 is coupled between the storage node m1 and a power supply line VSS, and the gate of the NMOS transistor ND0 is coupled to the storage node /m1. The PMOS transistor P1 is coupled between the power supply line VDD and the storage node /m1, and the gate of the PMOS transistor P1 is coupled to the storage node m1. The NMOS transistor ND1 is coupled between the storage node /m1 and the power supply line VSS, and the gate of the NMOS transistor ND1 is coupled to the storage node m1.

The NMOS transistor ND0 and the PMOS transistor P0 form an inverter. The NMOS transistor ND1 and the PMOS transistor P1 also form an inverter. The output of one inverter is coupled to the input of the other inverter. A flip-flop formed of the NMOS transistors ND0, ND1 and the PMOS transistors P0, P1 holds 1-bit information.

The Y cell DC0 is formed of NMOS transistors NA2, NA3, which are access transistors, NMOS transistors ND2, ND3, which are driver transistors, and PMOS transistors P2, P3.

The NMOS transistor NA2 is coupled between a storage node m0 and the bit line BL1, and the word line WL0 is coupled to the gate of the NMOS transistor NA2. The NMOS transistor NA3 is coupled between a storage node /m0 and the bit line /BL1, and the word line WL0 is coupled to the gate of the NMOS transistor NA3. The PMOS transistor P2 is coupled between the power supply line VDD and the storage node m0, and the gate of the PMOS transistor P2 is coupled to the storage node /m0. The NMOS transistor ND2 is coupled between the storage node m0 and the power supply line VSS, and the gate of the NMOS transistor ND2 is coupled to the storage node /m0. The PMOS transistor P3 is coupled between the power supply line VDD and the storage node /m0, and the gate of the PMOS transistor P3 is coupled to the storage node m0. The NMOS transistor ND3 is coupled between the storage node /m0 and the power supply line VSS, and the gate of the NMOS transistor ND3 is coupled to the storage node m0.

The NMOS transistor ND2 and the PMOS transistor P2 form an inverter. The NMOS transistor ND3 and the PMOS transistor P3 also form an inverter. The output of one inverter is coupled to the input of the other inverter. A flip-flop formed of the NMOS transistors ND2, ND3 and the PMOS transistors P2, P3 holds 1-bit information (stored data).

The memory cell MC0 #0 further includes a logical operation cell LCB0 and a logical operation cell LCA0. The logical operation cell LCB0 is disposed adjacent to both the X cell MDC0 and the Y cell DC0 in the column direction (Y direction). The logical operation cell LCA0 is disposed adjacent to the logical operation cell LCB0 in the column direction (Y direction).

The logical operation cell LCA0 outputs, to the match line MLA0, a result based on port A search data and data held by the Y cell DC0 and the X cell MDC0. More specifically, the logical operation cell LCA0 drives the match line MLA0 depending on whether data (the level of the storage node m1) in the Y cell DC0 matches the port A search data and whether data (the level of the storage node m0) in the X cell MDC0 matches the inverted level of the port A search data.

The logical operation cell LCB0 outputs, to the match line MLA0, a result based on port B search data and data held by the Y cell DC0 and the X cell MDC0. More specifically, the logical operation cell LCB0 drives the match line MLB0 depending on whether the data in the Y cell DC0 matches the port B search data and whether the data in the X cell MDC0 matches the inverted level of the port B search data.

The logical operation cell LCA0 includes NMOS transistors NS0-NS3. The logical operation cell LCB0 includes NMOS transistors NS4-NS7.

The NMOS transistors NS0, NS1 are series-coupled between the match line MLA0 and a sub-ground line MVSSA, and the gates of the NMOS transistors NS0, NS1 are respectively coupled to the search line SLA0 and the storage node m1. The NMOS transistors NS2, NS3 are series-coupled between the match line MLA0 and the sub-ground line MVSSA, and the gates of the NMOS transistors NS2, NS3 are respectively coupled to the search line /SLA0 and the storage node m0.

The NMOS transistors NS4, NS5 are series-coupled between the match line MLB0 and a sub-ground line MVSSB, and the gates of the NMOS transistors NS4, NS5 are respectively coupled to the search line SLB0 and the storage node m1.

The NMOS transistors NS6, NS7 are series-coupled between the match line MLB0 and the sub-ground line MVSSB, and the gates of the NMOS transistors NS6, NS7 are respectively coupled to the search line /SLB0 and the storage node m0.

Memory cells other than the memory cell MC0 #0 differ from the above example in the coupled word line, match lines, bit line pair, and search line pairs. However, the internal circuit configuration of each of such memory cells is the same as that of the memory cell MC0 #0 and will not be redundantly described in detail.

Further, although not depicted, the precharge circuit is disposed in association with each of the match lines MLA, MLB and the sub-ground lines MVSSA, MVSSB as described in conjunction with the first embodiment.

More specifically, the P-channel MOS transistor 30 is disposed in association with the match lines MLA, MLB.

The P-channel MOS transistor 30 is disposed between the power supply voltage VDD and the match lines MLA, MLB, and the gate of the P-channel MOS transistor 30 receives the input of the control signal PC.

The N-channel MOS transistor 31 is disposed in association with the sub-ground lines MVSSA, MVSSB.

The N-channel MOS transistor 31 is disposed between the ground voltage VSS and the sub-ground line MVSS, and the gate of the N-channel MOS transistor 31 receives the input of the control signal /PC. The control signal /PC is an inversion (complementary signal) of the control signal PC.

For example, before a search operation, the control signals PC, /PC are respectively set to the "L" level and the "H" level.

A precharge is performed when the control signal PC is at the "L" level and the control signal /PC is at the "H" level.

The match lines MLA, MLB are coupled to the power supply voltage VDD. Further, the sub-ground lines MVSSA, MVSSB are coupled to the ground voltage VSS. That is to say, the match lines MLA, MLB are precharged to the first potential, and the sub-ground lines MVSSA, MVSSB are precharged to the second potential.

Meanwhile, during a search operation, the control signal PC is set to the "H" level, and the control signal /PC is set to the "L" level. This turns off the P-channel MOS transistor 30, and turns off the N-channel MOS transistor 31.

Consequently, the match lines MLA, MLB and the sub-ground lines MVSSA, MVSSB are placed in the open state.

Figure 18:
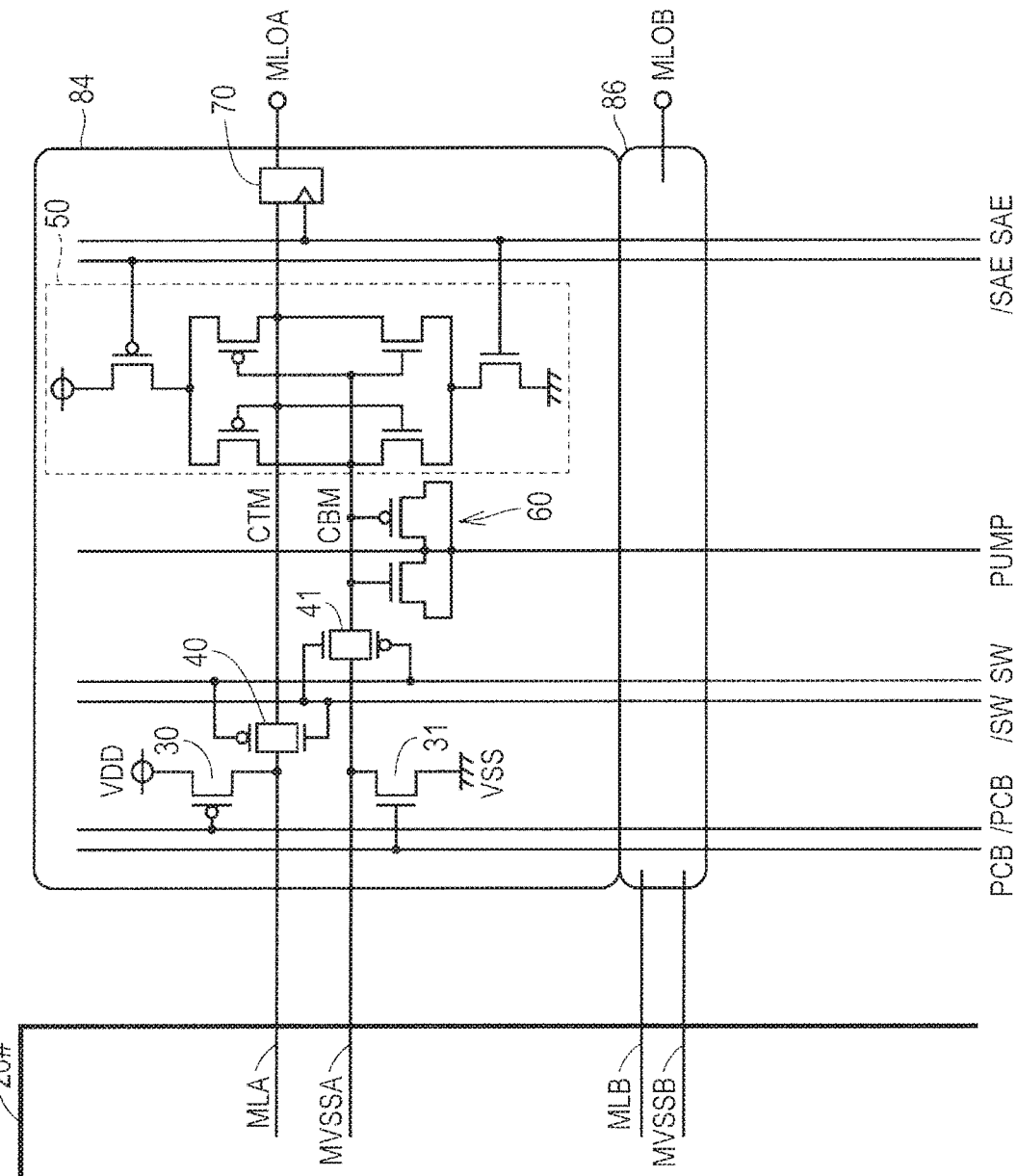
FIG. 18 is a diagram illustrating a configuration of the match amplifier according to the fourth embodiment.

FIG. 18 is a diagram illustrating a configuration of the match amplifier according to the fourth embodiment.

Referring to FIG. 18, a port A match amplifier 84 and a port B match amplifier 86 are disposed in association with each memory cell row.

The configurations of the match amplifiers 84, 86 are the same as described with reference to FIG. 13 and will not be redundantly described in detail. The following describes a case where the latch circuit 70 is activated in accordance with the control signal SAE.

The operations of the match amplifiers are also the same as described with reference to FIG. 14.

The operation, for example, of the match amplifier 84 will now be described.

When the search data is matched, the potential of the match line MLA is maintained. Further, when the control signals SW, /SW are respectively set to the "L" level and the "H" level, the transfer gate 40 is on so that the match line MLA is coupled to the input node CTM. The transfer gate 41 is on so that the sub-ground line MVSSA is coupled to the input node CBM.

In the above case, the sub-ground line MVSS is precharged to the ground voltage VSS.

The control signals SW, /SW are respectively set to the "H" level and the "L" level. This turns off the transfer gates 40, 41.

Next, the control signal PUMP is driven. More specifically, the control signal PUMP changes the signal line from the "L" level to the "H" level. This increases the potential of the input node CBM to the predetermined potential level.

Next, the control signals SAE, /SAE are respectively set to the "H" level and the "L" level. This activates the sense amplifier 50.

When the sense amplifier 50 is activated, the potential difference between the input node CTM and the input node CBM is amplified so that the input node CTM is set to the second potential of the ground voltage VSS, and that the input node CBM is set to the first potential of the power supply voltage VDD.

The latch circuit 70 outputs the "H" level as data MLOA in accordance with the potential of the input node CTM.

When the search data is 1-bit mismatched, the potential of the match line MLA begins to decrease. Further, if the control signals SW, /SW are respectively set to the "L" level and the "H" level, the transfer gate 40 is on so that the match line MLA is coupled to the input node CTM. The transfer gate 41 is on so that the sub-ground line MVSSA is coupled to the input node CBM.

Consequently, when the potential of the match line MLA decreases, the potential of the input node CTM in the sense amplifier 50 decreases.

As the match line ML is coupled to the sub-ground line MVSS, the potentials of the match line ML and sub-ground line MVSS change to the intermediate potential.

The control signals SW, /SW are respectively set to the "H" level and the "L" level. This turns off the transfer gates 40, 41.

Next, the control signal PUMP is driven. More specifically, the control signal PUMP changes the signal line from the "L" level to the "H" level.

Next, the control signals SAE, /SAE are respectively set to the "H" level and the "L" level. This activates the sense amplifier 50.

When the sense amplifier 50 is activated, the potential difference between the input node CTM and the input node CBM is amplified so that the input node CTM is set to the second potential of the ground voltage VSS, and that the input node CBM is set to the first potential of the power supply voltage VDD.

The latch circuit 70 outputs the "L" level as the data MLOA in accordance with the potential of the input node CTM.

The following describes a case where the search data is all-bit mismatched.

The potential of the match line MLA begins to decrease. Further, if the control signals SW, /SW are respectively set to the "L" level and the "H" level, the transfer gate 40 is on so that the match line ML is coupled to the input node CTM. The transfer gate 41 is on so that the sub-ground line MVSSA is coupled to the input node CBM.

Consequently, when the potential of the match line MLA decreases, the potential of the input node CTM in the sense amplifier 50 decreases.

As the match line MLA is coupled to the sub-ground line MVSS, the potentials of the match line MLA and sub-ground line MVSSA change to the intermediate potential.

The control signals SW, /SW are respectively set to the "H" level and the "L" level. This turns off the transfer gates 40, 41.

Next, the control signal PUMP is driven. More specifically, the control signal PUMP changes the signal line from the "L" level to the "H" level.

Next, the control signals SAE, /SAE are respectively set to the "H" level and the "L" level. This activates the sense amplifier 50.

When the sense amplifier 50 is activated, the potential difference between the input node CTM and the input node CBM is amplified so that the input node CTM is set to the second potential of the ground voltage VSS, and that the input node CBM is set to the first potential of the power supply voltage VDD.

The latch circuit 70 outputs the "L" level as the data MLOA in accordance with the potential of the input node CTM.

While the operation, for example, of the match amplifier 84 has been described, the operation of the match amplifier 86 is the same as that of the match amplifier 84.

Figure 19:
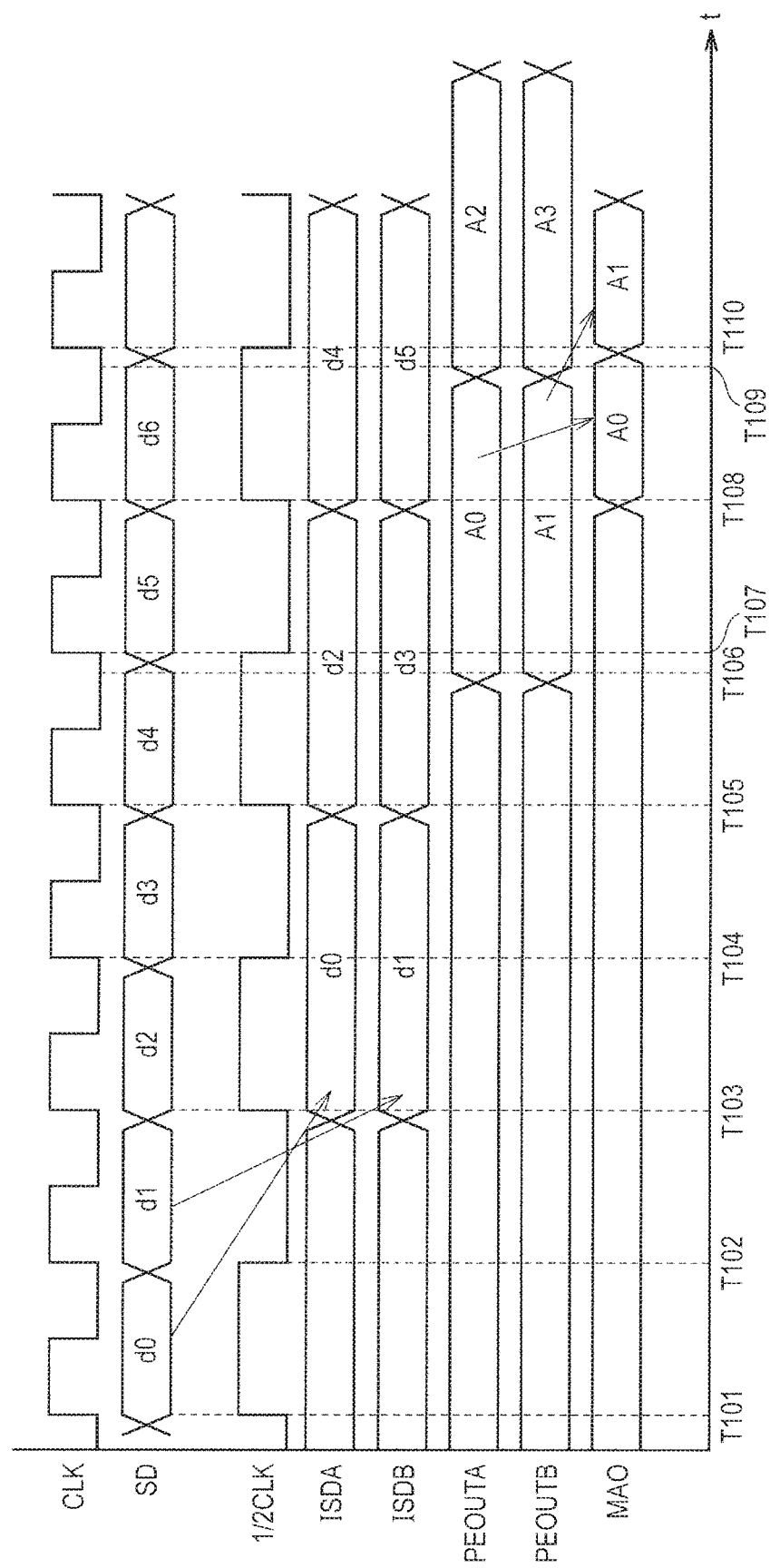
FIG. 19 is a timing diagram illustrating a data search operation of the search memory according to the fourth embodiment.

FIG. 19 is a timing diagram illustrating a data search operation of the search memory 8 # according to the fourth embodiment.

FIG. 19 depicts a case where the data generation section 92 begins at time T101 to successively acquire the external search data SD in synchronism with the clock signal CLK.

The present example depicts an exemplary case where data d0-d6 are acquired.

For example, at time T101, time T102, time T103, time T104, time T105, time T107, and time T108, the data generation section 92 respectively acquires the data d0-d6. The same holds true for the other data.

Further, the data generation section 92 begins at time T101 to generate and output the clock signal 1/2CLK, which has two times the period of the clock signal CLK.

At time T103, the data generation section 92 outputs clock signal 1/2CLK and internal search data ISDA, ISDB to the search line driver group 22.

More specifically, the data generation section 92 outputs the data d0, d2, d4, as the internal search data ISDA, to the search line driver group 22 in synchronism with the clock signal 1/2CLK.

The data generation section 92 outputs the data d1, d3, d5, as the internal search data ISDB, to the search line driver group 22 in synchronism with the clock signal 1/2CLK.

The segment 12 # operates in synchronism with the clock signal 1/2CLK.

At time T103, the segment 12 # acquires the data d0, as the internal search data ISDA for port A, in synchronism with the clock signal 1/2CLK, and executes a search operation.

Further, the segment 12 # acquires the data d1, as the internal search data ISDB for port B, in synchronism with the clock signal 1/2CLK, and executes a search operation.

A specific process for search operations is the same as described earlier and will not be redundantly described in detail.

Subsequently, at time T106, the priority encoder 80 receives outputs indicative of data d0 search results from the port A match amplifiers 84 in the segment 12 #, and outputs the highest-priority address information PEOUTA (address A0).

Further, the priority encoder 82 receives outputs indicative of data d1 search results from the port B match amplifiers 86 in the segment 12 #, and outputs the highest-priority address information PEOUTB (address A1).

The combination section 90 receives the inputs of address information PEOUTA (address A0), PEOUTB (address A1) from the priority encoders 80, 82, and outputs the external address output MAO in synchronism with the clock signal CLK.

More specifically, at time T108, the address A0 is outputted in synchronism with the clock signal CLK. Further, at time T110, the address A1 is outputted in synchronism with the clock signal CLK.

The same holds true for the other data.

At time T105, the segment 12 # acquires the data d2, as the internal search data ISDA for port A, in synchronism with the clock signal 1/2CLK, and executes a search operation.

Further, the segment 12 # acquires the data d3, as the internal search data ISDB for port B, in synchronism with the clock signal 1/2CLK, and executes a search operation.

Subsequently, at time T109, the priority encoder 80 receives outputs indicative of data d2 search results from the port A match amplifiers 84 in the segment 12 #, and outputs the highest-priority address information PEOUTA (address A2).

Further, the priority encoder 82 receives outputs indicative of data d3 search results from the port B match amplifiers 86 in the segment 12 #, and outputs the highest-priority address information PEOUTB (address A3).

The combination section 90 receives the inputs of address information PEOUTA (address A2), PEOUTB (address A3) from the priority encoders 80, 82, and outputs the external address output MAO in synchronism with the clock signal CLK.

Even in a case where the search memory 8 # operates in synchronism with the clock signal 1/2CLK, the above-described method enables the search memory 8 #, by using 2-port search cells, to operate apparently in synchronism with the clock signal CLK, which has two times the period of the clock signal 1/2CLK. That is to say, search performance can be improved by two-fold.

While the present disclosure has been described in detail based on the embodiments, the present disclosure is not limited to those embodiments but can be modified variously without departing from the spirit and scope of the present disclosure.

What is claimed is:

1. A semiconductor device comprising:
    a plurality of search memory cells;
    a match line that is coupled to the search memory cells; and
    a sub-ground line that is coupled to the search memory cells,
    wherein the match line is precharged to a first potential,
    wherein the sub-ground line is precharged to a second potential, and
    wherein, in a data search operation of the search memory cells, the match line is electrically coupled to the sub-ground line through the search memory cells and the match line and the sub-ground line are set to a potential between the first potential and the second potential.

2. The semiconductor device according to claim 1, further comprising:
    an amplifier that is coupled to the match line and the sub-ground line,
    wherein the amplifier amplifies a potential difference between the match line and the sub-ground line.

3. The semiconductor device according to claim 2,
    wherein the match line is used to determine whether or not search data matches data stored in the search memory cells, and
    wherein the amplifier is a differential sense amplifier.

4. The semiconductor device according to claim 2, further comprising:
    a first precharge circuit that precharges the match line to the first potential; and
    a second precharge circuit that precharges the sub-ground line to the second potential.

5. The semiconductor device according to claim 4, wherein the first and second precharge circuits operate in accordance with a precharge control signal.

* * * * *